US008223574B2

(12) United States Patent
Nautiyal et al.

(10) Patent No.: US 8,223,574 B2
(45) Date of Patent: Jul. 17, 2012

(54) TECHNIQUES FOR BLOCK REFRESHING A SEMICONDUCTOR MEMORY DEVICE

(75) Inventors: Vivek Nautiyal, Chavannes-Pres-Renens (CH); Serguei Okhonin, Lausanne (CH)

(73) Assignee: Micron Technology, Inc., Boise, ID (US)

( * ) Notice: Subject to any disclaimer, the term of this patent is extended or adjusted under 35 U.S.C. 154(b) by 334 days.

(21) Appl. No.: 12/580,171

(22) Filed: Oct. 15, 2009

(65) Prior Publication Data

US 2010/0110816 A1    May 6, 2010

Related U.S. Application Data

(60) Provisional application No. 61/111,665, filed on Nov. 5, 2008.

(51) Int. Cl.
*G11C 7/00* (2006.01)
(52) U.S. Cl. .............. 365/222; 365/189.04; 365/63
(58) Field of Classification Search .............. 365/222, 365/189.04, 63, 220, 230.03, 51, 189.06, 365/189.14, 191, 185.14, 185.04, 185.25, 365/185.26, 181
See application file for complete search history.

(56) References Cited

U.S. PATENT DOCUMENTS

| | | | |
|---|---|---|---|
| 3,439,214 A | 4/1969 | Kabell | |
| 3,997,799 A | 12/1976 | Baker | |
| 4,032,947 A | 6/1977 | Kesel et al. | |
| 4,250,569 A | 2/1981 | Sasaki et al. | |
| 4,262,340 A | 4/1981 | Sasaki et al. | |
| 4,298,962 A | 11/1981 | Hamano et al. | |
| 4,371,955 A | 2/1983 | Sasaki | |
| 4,527,181 A | 7/1985 | Sasaki | |
| 4,630,089 A | 12/1986 | Sasaki et al. | |
| 4,658,377 A | 4/1987 | McElroy | |
| 4,791,610 A | 12/1988 | Takemae | |
| 4,807,195 A | 2/1989 | Busch et al. | |

(Continued)

FOREIGN PATENT DOCUMENTS

CA    272437    7/1927

(Continued)

OTHER PUBLICATIONS

Tanabe et al., A 30-ns 64-MB DRAM with Built-in-Self-Test and Self-Repair Function, IEEE Journal of Solid State Circuits, vol. 27, No. 11, pp. 1525-1533, Nov. 1992.

(Continued)

*Primary Examiner* — Dang Nguyen
(74) *Attorney, Agent, or Firm* — Wilmer Cutler Pickering Hale and Dorr LLP

(57) ABSTRACT

Techniques for block refreshing a semiconductor memory device are disclosed. In one particular exemplary embodiment, the techniques may be realized as a method for block refreshing a semiconductor memory device. The method may comprise arranging a plurality of memory cells in one or more arrays of rows and columns. Each of the plurality of memory cells may comprise a first region coupled to a source line, a second region, a first body region disposed between the first region and the second region, wherein the body region may be electrically floating and charged to a first predetermined voltage potential, and a first gate coupled to a word line, wherein the first gate may be spaced apart from, and capacitively coupled to, the first body region. The method may also comprise applying voltage potentials to the plurality of memory cells to refresh a plurality of data states stored in the plurality of memory cells.

17 Claims, 17 Drawing Sheets

U.S. PATENT DOCUMENTS

| | | |
|---|---|---|
| 4,954,989 A | 9/1990 | Auberton-Herve et al. |
| 4,979,014 A | 12/1990 | Hieda et al. |
| 5,010,524 A | 4/1991 | Fifield et al. |
| 5,144,390 A | 9/1992 | Matloubian |
| 5,164,805 A | 11/1992 | Lee |
| 5,258,635 A | 11/1993 | Nitayama et al. |
| 5,313,432 A | 5/1994 | Lin et al. |
| 5,315,541 A | 5/1994 | Harari et al. |
| 5,350,938 A | 9/1994 | Matsukawa |
| 5,355,330 A | 10/1994 | Hisamoto et al. |
| 5,388,068 A | 2/1995 | Ghoshal et al. |
| 5,397,726 A | 3/1995 | Bergemont et al. |
| 5,432,730 A | 7/1995 | Shubat et al. |
| 5,446,299 A | 8/1995 | Acovic et al. |
| 5,448,513 A | 9/1995 | Hu et al. |
| 5,466,625 A | 11/1995 | Hsieh et al. |
| 5,489,792 A | 2/1996 | Hu et al. |
| 5,506,436 A | 4/1996 | Hayashi et al. |
| 5,515,383 A | 5/1996 | Katoozi |
| 5,526,307 A | 6/1996 | Yiu et al. |
| 5,528,062 A | 6/1996 | Hsieh et al. |
| 5,568,356 A | 10/1996 | Schwartz |
| 5,583,808 A | 12/1996 | Brahmbhatt |
| 5,593,912 A | 1/1997 | Rajeevakumar |
| 5,606,188 A | 2/1997 | Bronner et al. |
| 5,608,250 A | 3/1997 | Kalnitsky |
| 5,627,092 A | 5/1997 | Alsmeier et al. |
| 5,631,186 A | 5/1997 | Park et al. |
| 5,677,867 A | 10/1997 | Hazani |
| 5,696,718 A | 12/1997 | Hartmann |
| 5,740,099 A | 4/1998 | Tanigawa |
| 5,754,469 A | 5/1998 | Hung et al. |
| 5,774,411 A | 6/1998 | Hsieh et al. |
| 5,778,243 A | 7/1998 | Aipperspach et al. |
| 5,780,906 A | 7/1998 | Wu et al. |
| 5,784,311 A | 7/1998 | Assaderaghi et al. |
| 5,798,968 A | 8/1998 | Lee et al. |
| 5,811,283 A | 9/1998 | Sun |
| 5,847,411 A | 12/1998 | Morii |
| 5,877,978 A | 3/1999 | Morishita et al. |
| 5,886,376 A | 3/1999 | Acovic et al. |
| 5,886,385 A | 3/1999 | Arisumi et al. |
| 5,897,351 A | 4/1999 | Forbes |
| 5,929,479 A | 7/1999 | Oyama |
| 5,930,648 A | 7/1999 | Yang |
| 5,936,265 A | 8/1999 | Koga |
| 5,939,745 A | 8/1999 | Park et al. |
| 5,943,258 A | 8/1999 | Houston et al. |
| 5,943,581 A | 8/1999 | Lu et al. |
| 5,960,265 A | 9/1999 | Acovic et al. |
| 5,968,840 A | 10/1999 | Park et al. |
| 5,977,578 A | 11/1999 | Tang |
| 5,982,003 A | 11/1999 | Hu et al. |
| 5,986,914 A | 11/1999 | McClure |
| 6,018,172 A | 1/2000 | Hidada et al. |
| 6,048,756 A | 4/2000 | Lee et al. |
| 6,081,443 A | 6/2000 | Morishita |
| 6,096,598 A | 8/2000 | Furukawa et al. |
| 6,097,056 A | 8/2000 | Hsu et al. |
| 6,097,624 A | 8/2000 | Chung et al. |
| 6,111,778 A | 8/2000 | MacDonald et al. |
| 6,121,077 A | 9/2000 | Hu et al. |
| 6,133,597 A | 10/2000 | Li et al. |
| 6,157,216 A | 12/2000 | Lattimore et al. |
| 6,171,923 B1 | 1/2001 | Chi et al. |
| 6,177,300 B1 | 1/2001 | Houston et al. |
| 6,177,698 B1 | 1/2001 | Gruening et al. |
| 6,177,708 B1 | 1/2001 | Kuang et al. |
| 6,214,694 B1 | 4/2001 | Leobandung et al. |
| 6,222,217 B1 | 4/2001 | Kunikiyo |
| 6,225,158 B1 | 5/2001 | Furukawa et al. |
| 6,245,613 B1 | 6/2001 | Hsu et al. |
| 6,252,281 B1 | 6/2001 | Yamamoto et al. |
| 6,262,935 B1 | 7/2001 | Parris et al. |
| 6,292,424 B1 | 9/2001 | Ohsawa |
| 6,297,090 B1 | 10/2001 | Kim |
| 6,300,649 B1 | 10/2001 | Hu et al. |
| 6,320,227 B1 | 11/2001 | Lee et al. |
| 6,333,532 B1 | 12/2001 | Davari et al. |
| 6,333,866 B1 | 12/2001 | Ogata |
| 6,350,653 B1 | 2/2002 | Adkisson et al. |
| 6,351,426 B1 | 2/2002 | Ohsawa |
| 6,359,802 B1 | 3/2002 | Lu et al. |
| 6,384,445 B1 | 5/2002 | Hidaka et al. |
| 6,391,658 B1 | 5/2002 | Gates et al. |
| 6,403,435 B1 | 6/2002 | Kang et al. |
| 6,421,269 B1 | 7/2002 | Somasekhar et al. |
| 6,424,011 B1 | 7/2002 | Assaderaghi et al. |
| 6,424,016 B1 | 7/2002 | Houston |
| 6,429,477 B1 | 8/2002 | Mandelman et al. |
| 6,432,769 B1 | 8/2002 | Fukuda et al. |
| 6,440,872 B1 | 8/2002 | Mandelman et al. |
| 6,441,435 B1 | 8/2002 | Chan |
| 6,441,436 B1 | 8/2002 | Wu et al. |
| 6,466,511 B2 | 10/2002 | Fujita et al. |
| 6,479,862 B1 | 11/2002 | King et al. |
| 6,480,407 B1 | 11/2002 | Keeth |
| 6,492,211 B1 | 12/2002 | Divakaruni et al. |
| 6,518,105 B1 | 2/2003 | Yang et al. |
| 6,531,754 B1 | 3/2003 | Nagano et al. |
| 6,537,871 B2 | 3/2003 | Forbes et al. |
| 6,538,916 B2 | 3/2003 | Ohsawa |
| 6,544,837 B1 | 4/2003 | Divakaruni et al. |
| 6,548,848 B2 | 4/2003 | Horiguchi et al. |
| 6,549,450 B1 | 4/2003 | Hsu et al. |
| 6,552,398 B2 | 4/2003 | Hsu et al. |
| 6,552,932 B1 | 4/2003 | Cernea |
| 6,556,477 B2 | 4/2003 | Hsu et al. |
| 6,560,142 B1 | 5/2003 | Ando |
| 6,563,733 B2 | 5/2003 | Liu et al. |
| 6,566,177 B1 | 5/2003 | Radens et al. |
| 6,567,330 B2 | 5/2003 | Fujita et al. |
| 6,573,566 B2 | 6/2003 | Ker et al. |
| 6,574,135 B1 | 6/2003 | Komatsuzaki |
| 6,590,258 B2 | 7/2003 | Divakauni et al. |
| 6,590,259 B2 | 7/2003 | Adkisson et al. |
| 6,617,651 B2 | 9/2003 | Ohsawa |
| 6,621,725 B2 | 9/2003 | Ohsawa |
| 6,632,723 B2 | 10/2003 | Watanabe et al. |
| 6,650,565 B1 | 11/2003 | Ohsawa |
| 6,653,175 B1 | 11/2003 | Nemati et al. |
| 6,686,624 B2 | 2/2004 | Hsu |
| 6,703,673 B2 | 3/2004 | Houston |
| 6,707,118 B2 | 3/2004 | Muljono et al. |
| 6,714,436 B1 | 3/2004 | Burnett et al. |
| 6,721,222 B2 | 4/2004 | Somasekhar et al. |
| 6,825,524 B1 | 11/2004 | Ikehashi et al. |
| 6,861,689 B2 | 3/2005 | Burnett |
| 6,870,225 B2 | 3/2005 | Bryant et al. |
| 6,882,566 B2 | 4/2005 | Nejad et al. |
| 6,888,770 B2 | 5/2005 | Ikehashi |
| 6,894,913 B2 | 5/2005 | Yamauchi |
| 6,897,098 B2 | 5/2005 | Hareland et al. |
| 6,903,984 B1 | 6/2005 | Tang et al. |
| 6,909,151 B2 | 6/2005 | Hareland et al. |
| 6,912,150 B2 | 6/2005 | Portmann et al. |
| 6,913,964 B2 | 7/2005 | Hsu |
| 6,936,508 B2 | 8/2005 | Visokay et al. |
| 6,969,662 B2 | 11/2005 | Fazan et al. |
| 6,975,536 B2 | 12/2005 | Maayan et al. |
| 6,982,902 B2 | 1/2006 | Gogl et al. |
| 6,987,041 B2 | 1/2006 | Ohkawa |
| 7,030,436 B2 | 4/2006 | Forbes |
| 7,037,790 B2 | 5/2006 | Chang et al. |
| 7,041,538 B2 | 5/2006 | Ieong et al. |
| 7,042,765 B2 | 5/2006 | Sibigtroth et al. |
| 7,061,806 B2 | 6/2006 | Tang et al. |
| 7,085,153 B2 | 8/2006 | Ferrant et al. |
| 7,085,156 B2 | 8/2006 | Ferrant et al. |
| 7,170,807 B2 | 1/2007 | Fazan et al. |
| 7,177,175 B2 | 2/2007 | Fazan et al. |
| 7,187,581 B2 | 3/2007 | Ferrant et al. |
| 7,230,846 B2 * | 6/2007 | Keshavarzi et al. ........... 365/177 |
| 7,233,024 B2 | 6/2007 | Scheuerlein et al. |
| 7,256,459 B2 | 8/2007 | Shino |
| 7,301,803 B2 | 11/2007 | Okhonin et al. |
| 7,301,838 B2 | 11/2007 | Waller |

| | | |
|---|---|---|
| 7,317,641 B2 | 1/2008 | Scheuerlein |
| 7,324,387 B1 | 1/2008 | Bergemont et al. |
| 7,335,934 B2 | 2/2008 | Fazan |
| 7,341,904 B2 | 3/2008 | Willer |
| 7,416,943 B2 | 8/2008 | Figura et al. |
| 7,456,439 B1 | 11/2008 | Horch |
| 7,477,540 B2 | 1/2009 | Okhonin et al. |
| 7,492,632 B2 | 2/2009 | Carman |
| 7,517,744 B2 | 4/2009 | Mathew et al. |
| 7,539,041 B2 | 5/2009 | Kim et al. |
| 7,542,340 B2 | 6/2009 | Fisch et al. |
| 7,542,345 B2 | 6/2009 | Okhonin et al. |
| 7,545,694 B2 | 6/2009 | Srinivasa Raghavan et al. |
| 7,606,066 B2 | 10/2009 | Okhonin et al. |
| 7,696,032 B2 | 4/2010 | Kim et al. |
| 7,924,630 B2 * | 4/2011 | Carman ............... 365/189.04 |
| 2001/0055859 A1 | 12/2001 | Yamada et al. |
| 2002/0030214 A1 | 3/2002 | Horiguchi |
| 2002/0034855 A1 | 3/2002 | Horiguchi et al. |
| 2002/0036322 A1 | 3/2002 | Divakauni et al. |
| 2002/0051378 A1 | 5/2002 | Ohsawa |
| 2002/0064913 A1 | 5/2002 | Adkisson et al. |
| 2002/0070411 A1 | 6/2002 | Vermandel et al. |
| 2002/0072155 A1 | 6/2002 | Liu et al. |
| 2002/0076880 A1 | 6/2002 | Yamada et al. |
| 2002/0086463 A1 | 7/2002 | Houston et al. |
| 2002/0089038 A1 | 7/2002 | Ning |
| 2002/0098643 A1 | 7/2002 | Kawanaka et al. |
| 2002/0110018 A1 | 8/2002 | Ohsawa |
| 2002/0114191 A1 | 8/2002 | Iwata et al. |
| 2002/0130341 A1 | 9/2002 | Horiguchi et al. |
| 2002/0160581 A1 | 10/2002 | Watanabe et al. |
| 2002/0180069 A1 | 12/2002 | Houston |
| 2003/0003608 A1 | 1/2003 | Arikado et al. |
| 2003/0015757 A1 | 1/2003 | Ohsawa |
| 2003/0035324 A1 | 2/2003 | Fujita et al. |
| 2003/0042516 A1 | 3/2003 | Forbes et al. |
| 2003/0047784 A1 | 3/2003 | Matsumoto et al. |
| 2003/0057487 A1 | 3/2003 | Yamada et al. |
| 2003/0057490 A1 | 3/2003 | Nagano et al. |
| 2003/0102497 A1 | 6/2003 | Fried et al. |
| 2003/0112659 A1 | 6/2003 | Ohsawa |
| 2003/0123279 A1 | 7/2003 | Aipperspach et al. |
| 2003/0146474 A1 | 8/2003 | Ker et al. |
| 2003/0146488 A1 | 8/2003 | Nagano et al. |
| 2003/0151112 A1 | 8/2003 | Yamada et al. |
| 2003/0231521 A1 | 12/2003 | Ohsawa |
| 2004/0021137 A1 | 2/2004 | Fazan et al. |
| 2004/0021179 A1 | 2/2004 | Lee et al. |
| 2004/0029335 A1 | 2/2004 | Lee et al. |
| 2004/0075143 A1 | 4/2004 | Bae et al. |
| 2004/0108532 A1 | 6/2004 | Forbes |
| 2004/0188714 A1 | 9/2004 | Scheuerlein et al. |
| 2004/0217420 A1 | 11/2004 | Yeo et al. |
| 2005/0001257 A1 | 1/2005 | Schloesser et al. |
| 2005/0001269 A1 | 1/2005 | Hayashi et al. |
| 2005/0017240 A1 | 1/2005 | Fazan |
| 2005/0047240 A1 | 3/2005 | Ikehashi et al. |
| 2005/0062088 A1 | 3/2005 | Houston |
| 2005/0063224 A1 | 3/2005 | Fazan et al. |
| 2005/0064659 A1 | 3/2005 | Willer |
| 2005/0105342 A1 | 5/2005 | Tang et al. |
| 2005/0111255 A1 | 5/2005 | Tang et al. |
| 2005/0121710 A1 | 6/2005 | Shino |
| 2005/0135169 A1 | 6/2005 | Somasekhar et al. |
| 2005/0141262 A1 | 6/2005 | Yamada et al. |
| 2005/0141290 A1 | 6/2005 | Tang et al. |
| 2005/0145886 A1 | 7/2005 | Keshavarzi et al. |
| 2005/0145935 A1 | 7/2005 | Keshavarzi et al. |
| 2005/0167751 A1 | 8/2005 | Nakajima et al. |
| 2005/0189576 A1 | 9/2005 | Ohsawa |
| 2005/0208716 A1 | 9/2005 | Takaura et al. |
| 2005/0226070 A1 | 10/2005 | Ohsawa |
| 2005/0232043 A1 | 10/2005 | Ohsawa |
| 2005/0242396 A1 | 11/2005 | Park et al. |
| 2005/0265107 A1 | 12/2005 | Tanaka |
| 2006/0043484 A1 | 3/2006 | Cabral et al. |
| 2006/0091462 A1 | 5/2006 | Okhonin et al. |
| 2006/0098481 A1 | 5/2006 | Okhonin et al. |

| | | |
|---|---|---|
| 2006/0126374 A1 | 6/2006 | Waller et al. |
| 2006/0131650 A1 * | 6/2006 | Okhonin et al. ............ 257/347 |
| 2006/0223302 A1 | 10/2006 | Chang et al. |
| 2007/0008811 A1 | 1/2007 | Keeth et al. |
| 2007/0023833 A1 | 2/2007 | Okhonin et al. |
| 2007/0045709 A1 | 3/2007 | Yang |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0114599 A1 | 5/2007 | Hshieh |
| 2007/0133330 A1 | 6/2007 | Ohsawa |
| 2007/0138524 A1 | 6/2007 | Kim et al. |
| 2007/0138530 A1 | 6/2007 | Okhonin et al. |
| 2007/0187751 A1 | 8/2007 | Hu et al. |
| 2007/0187775 A1 | 8/2007 | Okhonin et al. |
| 2007/0200176 A1 | 8/2007 | Kammler et al. |
| 2007/0252205 A1 | 11/2007 | Hoentschel et al. |
| 2007/0263466 A1 * | 11/2007 | Morishita et al. ............ 365/208 |
| 2007/0278578 A1 | 12/2007 | Yoshida et al. |
| 2008/0049486 A1 | 2/2008 | Gruening-von Schwerin |
| 2008/0083949 A1 | 4/2008 | Zhu et al. |
| 2008/0099808 A1 | 5/2008 | Burnett et al. |
| 2008/0130379 A1 | 6/2008 | Ohsawa |
| 2008/0133849 A1 | 6/2008 | Deml et al. |
| 2008/0165577 A1 | 7/2008 | Fazan et al. |
| 2008/0253179 A1 | 10/2008 | Slesazeck |
| 2008/0258206 A1 | 10/2008 | Hofmann |
| 2009/0086535 A1 | 4/2009 | Ferrant et al. |
| 2009/0121269 A1 | 5/2009 | Caillat et al. |
| 2009/0127592 A1 | 5/2009 | El-Kareh et al. |
| 2009/0201723 A1 | 8/2009 | Okhonin et al. |
| 2010/0085813 A1 | 4/2010 | Shino |
| 2010/0091586 A1 | 4/2010 | Carman |
| 2010/0110816 A1 | 5/2010 | Nautiyal et al. |

FOREIGN PATENT DOCUMENTS

| | | |
|---|---|---|
| EP | 0 030 856 | 6/1981 |
| EP | 0 350 057 | 1/1990 |
| EP | 0 354 348 | 2/1990 |
| EP | 0 202 515 | 3/1991 |
| EP | 0 207 619 | 8/1991 |
| EP | 0 175 378 | 11/1991 |
| EP | 0 253 631 | 4/1992 |
| EP | 0 513 923 | 11/1992 |
| EP | 0 300 157 | 5/1993 |
| EP | 0 564 204 | 10/1993 |
| EP | 0 579 566 | 1/1994 |
| EP | 0 362 961 | 2/1994 |
| EP | 0 599 506 | 6/1994 |
| EP | 0 359 551 | 12/1994 |
| EP | 0 366 882 | 5/1995 |
| EP | 0 465 961 | 8/1995 |
| EP | 0 694 977 | 1/1996 |
| EP | 0 333 426 | 7/1996 |
| EP | 0 727 820 | 8/1996 |
| EP | 0 739 097 | 10/1996 |
| EP | 0 245 515 | 4/1997 |
| EP | 0 788 165 | 8/1997 |
| EP | 0 801 427 | 10/1997 |
| EP | 0 510 607 | 2/1998 |
| EP | 0 537 677 | 8/1998 |
| EP | 0 858 109 | 8/1998 |
| EP | 0 860 878 | 8/1998 |
| EP | 0 869 511 | 10/1998 |
| EP | 0 878 804 | 11/1998 |
| EP | 0 920 059 | 6/1999 |
| EP | 0 924 766 | 6/1999 |
| EP | 0 642 173 | 7/1999 |
| EP | 0 727 822 | 8/1999 |
| EP | 0 933 820 | 8/1999 |
| EP | 0 951 072 | 10/1999 |
| EP | 0 971 360 | 1/2000 |
| EP | 0 980 101 | 2/2000 |
| EP | 0 601 590 | 4/2000 |
| EP | 0 993 037 | 4/2000 |
| EP | 0 836 194 | 5/2000 |
| EP | 0 599 388 | 8/2000 |
| EP | 0 689 252 | 8/2000 |

| EP | 0 606 758 | 9/2000 |
| EP | 0 682 370 | 9/2000 |
| EP | 1 073 121 | 1/2001 |
| EP | 0 726 601 | 9/2001 |
| EP | 0 731 972 | 11/2001 |
| EP | 1 162 663 | 12/2001 |
| EP | 1 162 744 | 12/2001 |
| EP | 1 179 850 | 2/2002 |
| EP | 1 180 799 | 2/2002 |
| EP | 1 191 596 | 3/2002 |
| EP | 1 204 146 | 5/2002 |
| EP | 1 204 147 | 5/2002 |
| EP | 1 209 747 | 5/2002 |
| EP | 0 744 772 | 8/2002 |
| EP | 1 233 454 | 8/2002 |
| EP | 0 725 402 | 9/2002 |
| EP | 1 237 193 | 9/2002 |
| EP | 1 241 708 | 9/2002 |
| EP | 1 253 634 | 10/2002 |
| EP | 0 844 671 | 11/2002 |
| EP | 1 280 205 | 1/2003 |
| EP | 1 288 955 | 3/2003 |
| FR | 2 197 494 | 3/1974 |
| GB | 1 414 228 | 11/1975 |
| JP | H04-176163 A | 6/1922 |
| JP | S62-007149 A | 1/1987 |
| JP | S62-272561 | 11/1987 |
| JP | 02-294076 | 12/1990 |
| JP | 03-171768 | 7/1991 |
| JP | 05-347419 | 12/1993 |
| JP | 08-213624 | 8/1996 |
| JP | H08-213624 A | 8/1996 |
| JP | 08-274277 | 10/1996 |
| JP | H08-316337 A | 11/1996 |
| JP | 09-046688 | 2/1997 |
| JP | 09-082912 | 3/1997 |
| JP | 10-242470 | 9/1998 |
| JP | 11-087649 | 3/1999 |
| JP | 2000-247735 A | 8/2000 |
| JP | 12-274221 A | 9/2000 |
| JP | 12-389106 A | 12/2000 |
| JP | 13-180633 A | 6/2001 |
| JP | 2002-009081 | 1/2002 |
| JP | 2002-083945 | 3/2002 |
| JP | 2002-094027 | 3/2002 |
| JP | 2002-176154 | 6/2002 |
| JP | 2002-246571 | 8/2002 |
| JP | 2002-329795 | 11/2002 |
| JP | 2002-343886 | 11/2002 |
| JP | 2002-353080 | 12/2002 |
| JP | 2003-031693 | 1/2003 |
| JP | 2003-68877 A | 3/2003 |
| JP | 2003-086712 | 3/2003 |
| JP | 2003-100641 | 4/2003 |
| JP | 2003-100900 | 4/2003 |
| JP | 2003-132682 | 5/2003 |
| JP | 2003-203967 | 7/2003 |
| JP | 2003-243528 | 8/2003 |
| JP | 2004-335553 | 11/2004 |
| WO | WO 01/24268 | 4/2001 |
| WO | WO 2005/008778 | 1/2005 |

OTHER PUBLICATIONS

Arimoto et al., A Configurable Enhanced T2RAM Macro for System-Level Power Management Unified Memory, 2006, VLSI Symposium.
Arimoto, A High-Density Scalable Twin Transistor RAM (TTRAM) With Verify Control for SOI Platform Memory IPs, Nov. 2007, Solid-State Circuits.
Asian Technology Information Program (ATIP) Scoops™, "Novel Capacitorless 1T-DRAM From Single-Gate PD-SOI to Double-Gate FinDRAM", May 9, 2005, 9 pages.
Assaderaghi et al., "A Dynamic Threshold Voltage MOSFET (DTMOS) for Ultra-Low Voltage Operation", IEEE IEDM, 1994, pp. 809-812.
Assaderaghi et al., "A Dynamic Threshold Voltage Mosfet (DTMOS) for Very Low Voltage Operation", IEEE Electron Device Letters, vol. 15, No. 12, Dec. 1994, pp. 510-512.
Assaderaghi et al., "A Novel Silicon-On-Insulator (SOI) MOSFET for Ultra Low Voltage Operation", 1994 IEEE Symposium on Low Power Electronics, pp. 58-59.
Assaderaghi et al., "Dynamic Threshold-Voltage MOSFET (DTMOS) for Ultra-Low Voltage VLSI", IEEE Transactions on Electron Devices, vol. 44, No. 3, Mar. 1997, pp. 414-422.
Assaderaghi et al., "High-Field Transport of Inversion-Layer Electrons and Holes Including Velocity Overshoot", IEEE Transactions on Electron Devices, vol. 44, No. 4, Apr. 1997, pp. 664-671.
Avci, Floating Body Cell (FBC) Memory for 16-nm Technology with Low Variation on Thin Silicon and 10-nm BOX, Oct. 2008, SOI Conference.
Bae, Evaluation of 1T RAM using Various Operation Methods with SOONO (Silicon-On-ONO) device, Dec. 2008, IEDM.
Ban, A Scaled Floating Body Cell (FBC) Memory with High-k+Metal Gate on Thin-Silicon and Thin-BOX for 16-nm Technology Node and Beyond, Jun. 2008, VLSI Symposium.
Ban, Ibrahim, et al., "Floating Body Cell with Independently-Controlled Double Gates for High Density Memory," Electron Devices Meeting, 2006. IEDM '06. International, IEEE, Dec. 11-13, 2006.
Bawedin, Maryline, et al., A Capacitorless 1T Dram on SOI Based on Dynamic Coupling and Double-Gate Operation, IEEE Electron Device Letters, vol. 29, No. 7, Jul. 2008.
Blagojevic et al., Capacitorless 1T DRAM Sensing Scheme Automatice Reference Generation, 2006, IEEE J.Solid State Circuits.
Blalock, T., "A High-Speed Clamped Bit-Line Current-Mode Sense Amplifier", IEEE Journal of Solid-State Circuits, vol. 26, No. 4, Apr. 1991, pp. 542-548.
Butt, Scaling Limits of Double Gate and Surround Gate Z-RAM Cells, 2007, IEEE Trans. On El. Dev.
Chan et al., "Effects of Floating Body on Double Polysilicon Partially Depleted SOI Nonvolatile Memory Cell", IEEE Electron Device Letters, vol. 24, No. 2, Feb. 2003, pp. 75-77.
Chan, et al., "SOI MOSFET Design for All-Dimensional Scaling with Short Channel, Narrow Width and Ultra-thin Films", IEEE IEDM, 1995, pp. 631-634.
Chi et al., "Programming and Erase with Floating-Body for High Density Low Voltage Flash EEPROM Fabricated on SOI Wafers", Proceedings 1995 IEEE International SOI Conference, Oct. 1995, pp. 129-130.
Cho et al., "Novel DRAM Cell with Amplified Capacitor for Embedded Application", IEEE, Jun. 2009.
Cho, A novel capacitor-less DRAM cell using Thin Capacitively-Coupled Thyristor (TCCT), 2005, IEDM.
Choi et al., Current Flow Mechanism in Schottky-Barrier MOSFET and Application to the 1T-DRAM, 2008, SSDM.
Choi, High Speed Flash Memory and 1T-DRAM on Dopant Segregated Schottky Barrier (DSSB) FinFET SONOS Device for Multifunctional SoC Applications, Dec. 2008, IEDM.
Clarke, Junctionless Transistors Could Simply Chip Making, Say Researchers, EE Times, Feb. 2010, www.eetimes.com/showArticle.jhtml?articleID=223100050.
Colinge, J.P., "An SOI voltage-controlled bipolar-MOS device", IEEE Transactions on Electron Devices, vol. ED-34, No. 4, Apr. 1987, pp. 845-849.
Colinge, Nanowire Transistors Without Junctions, Nature NanoTechnology, vol. 5, 2010, pp. 225-229.
Collaert et al., Optimizing the Readout Bias for the Capacitorless 1T Bulk FinFET RAM Cell, 2009, IEEE EDL.
Collaert, Comparison of scaled floating body RAM architectures, Oct. 2008, SOI Conference.
Ershov, Optimization of Substrate Doping for Back-Gate Control in SOI T-RAM Memory Technology, 2005, SOI Conference.
Ertosun et al., A Highly Scalable Capacitorless Double Gate Quantum Well Single Transistor DRAM: 1T-QW DRAM, 2008, IEEE EDL.
Fazan et al., "A Simple 1-Transistor Capacitor-Less Memory Cell for High Performance Embedded DRAMs", IEEE 2002 Custom Integrated Circuits Conference, Jun. 2002, pp. 99-102.
Fazan, A Highly Manufacturable Capacitor-less 1T-DRAM Concept, 2002, SPIE.

Fazan, et al., "Capacitor-Less 1-Transistor DRAM", 2002 IEEE International SOI Conference, Oct. 2002, pp. 10-13.

Fazan, P., "MOSFET Design Simplifies DRAM", EE Times, May 14, 2002 (3 pages).

Fisch, Beffa, Bassin, Soft Error Performance of Z-Ram Floating Body Memory, 2006, SOI Conference.

Fisch, Carman, Customizing SOI Floating Body Memory Architecture for System Performance and Lower Cost, 2006, SAME.

Fisch, Z-RAM® Ultra-Dense Memory for 90nm and Below, 2006, Hot Chips.

Fossum et al., New Insights on Capacitorless Floating Body DRAM Cells, 2007, IEEE EDL.

Fujita, Array Architectureof Floating Body Cell (FBC) with Quasi-Shielded Open Bit Line Scheme for sub-40nm Node, 2008, SOI Conference.

Furuhashi, Scaling Scenario of Floating Body Cell (FBC) Suppressing Vth Variation Due to Random Dopant Fluctuation, Dec. 2008, SOI Conference.

Furuyama et al., "An Experimental 2-bit/Cell Storage DRAM for Macrocell or Memory-on-Logic Application", IEEE Journal of Solid-State Circuits, vol. 24, No. 2, Apr. 1989, pp. 388-393.

Giffard et al., "Dynamic Effects in SOI MOSFET's", IEEE, 1991, pp. 160-161.

Gupta et al., SPICE Modeling of Self Sustained Operation (SSO) to Program Sub-90nm Floating Body Cells, Oct. 2009, Conf on Simulation of Semiconductor Processes & Devices.

Han et al., Bulk FinFET Unified-RAM (URAM) Cell for Multifunctioning NVM and Capacitorless 1T-DRAM, 2008, IEEE EDL.

Han et al., Partially Depleted SONOS FinFET for Unified RAM (URAM) Unified Function for High-Speed 1T DRAM and Nonvolatile Memory, 2008, IEEE EDL.

Han, Energy Band Engineered Unified-RAM (URAM) for Multi-Functioning 1T-DRAM and NVM, Dec. 2008, IEDM.

Han, Parasitic BJT Read Method for High-Performance Capacitorless 1T-DRAM Mode in Unified RAM, Oct. 2009, IEEE EDL.

Hara, Y., "Toshiba's DRAM Cell Piggybacks on SOI Wafer", EE Times, Jun. 2003.

Hu, C., "SOI (Silicon-on-Insulator) for High Speed Ultra Large Scale Integration", Jpn. J. Appl. Phys. vol. 33 (1994) pp. 365-369, Part 1, No. 1B, Jan. 1994.

Idei et al., "Soft-Error Characteristics in Bipolar Memory Cells with Small Critical Charge", IEEE Transactions on Electron Devices, vol. 38, No. 11, Nov. 1991, pp. 2465-2471.

Ikeda et al., "3-Dimensional Simulation of Turn-off Current in Partially Depleted SOI MOSFETs", IEIC Technical Report, Institute of Electronics, Information and Communication Engineers, 1998, vol. 97, No. 557 (SDM97 186-198), pp. 27-34.

Inoh et al., "FBC (Floating Body Cell) for Embedded DRAM on SOI", 2003 Symposium on VLSI Circuits Digest of Technical Papers, Jun. 2003 (2 pages).

Iyer et al., "SOI MOSFET on Low Cost SPIMOX Substrate", IEEE IEDM, Sep. 1998, pp. 1001-1004.

Jang et al., Highly scalable Z-RAM with remarkably long data retention for DRAM application, Jun. 2009, VLSI.

Jeong et al., "A Capacitor-less 1T DRAM Cell Based on a Surrounding Gate MOSFET with Vertical Channel", Technology Development Team, Technology Development Team, Samsung Electronics Co., Ltd., May 2007.

Jeong et al., "A New Capacitorless 1T DRAm Cell: Surrounding Gate MOSFET with Vertical Channel (SGVC Cell)", IEEE Transactions on Nanotechnology, vol. 6, No. 3, May 2007.

Jeong et al., "Capacitorless DRAM Cell with Highly Scalable Surrounding Gate Structure", Extended Abstracts of the 2006 International Conference on Solid State Devices and Materials, pp. 574-575, Yokohama (2006).

Jeong et al., "Capacitorless Dynamic Random Access Memory Cell with Highly Scalable Surrounding Gate Structure", Japanese Journal of Applied Physics, vol. 46, No. 4B, pp. 2143-2147 (2007).

Kedzierski, J.; "Design Analysis of Thin-Body Silicide Source/Drain Devices", 2001 IEEE International SOI Conference, Oct. 2001, pp. 21-22.

Kim et al., "Chip Level Reliability on SOI Embedded Memory", Proceedings 1998 IEEE International SOI Conference, Oct. 1998, pp. 135-139.

Kuo et al., "A Capacitorless Double-Gate DRAM Cell Design for High Density Applications", IEEE IEDM, Feb. 2002, pp. 843-846.

Kuo et al., "A Capacitorless Double-Gate DRAM Cell", IEEE Electron Device Letters, vol. 23, No. 6, Jun. 2002, pp. 345-347.

Kuo et al., A Capacitorless Double Gate DRAM Technology for Sub 100 nm Embedded and Stand Alone Memory Applications, 2003, IEEE Trans. On El. Dev.

Kwon et al., "A Highly Scalable 4F2 DRAm Cell Utilizing a Doubly Gated Vertical Channel", Extended Abstracts of the 2009 International Conference on Solid State Devices and Materials, UC Berkley, pp. 142-143 Sendai (2009).

Lee et al., "A Novel Pattern Transfer Process for Bonded SOI Gigabit DRAMs", Proceedings 1996 IEEE International SOI Conference, Oct. 1996, pp. 114-115.

Leiss et al., dRAM Design Using the Taper-Isolated Dynamic RAM Cell, IEEE Transactions on Electron Devices, vol. ED-29, No. 4, Apr. 1982, pp. 707-714.

Lin et al., "Opposite Side Floating Gate SOI Flash Memory Cell", IEEE, Mar. 2000, pp. 12-15.

Liu et al., Surface Generation-Recombination Processes of Gate and STI Oxide Interfaces Responsible for Junction Leakage on SOI, Sep. 2009, ECS Transactions, vol. 25.

Liu, Surface Recombination-Generation Processes of Gate, STI and Buried Oxide Interfaces Responsible for Junction Leakage on SOI, May 2009, ICSI.

Lončar et al., "One of Application of SOI Memory Cell—Memory Array", IEEE Proc. 22nd International Conference on Microelectronics (MIEL 2000), vol. 2, NIŠ, Serbia, May 14-17, 2000, pp. 455-458.

Lu et al., A Novel Two- Transistor Floating Body/Gate Cell for Low Power Nanoscale Embedded DRAM, 2008, IEEE Trans. On El. Dev.

Ma, et al., "Hot-Carrier Effects in Thin-Film Fully Depleted SOI MOSFET's", IEEE Electron Device Letters, vol. 15, No. 6, Jun. 1994, pp. 218-220.

Malhi et al., "Characteristics and Three-Dimensional Integration of MOSFET's in Small-Grain LPCVD Polycrystalline Silicon", IEEE Transactions on Electron Devices, vol. ED-32, No. 2, Feb. 1985, pp. 258-281.

Malinge, An 8Mbit DRAM Design Using a 1TBulk Cell, 2005, VLSI Circuits.

Mandelman et al, "Floating-Body Concerns for SOI Dynamic Random Access Memory (DRAM)", Proceedings 1996 IEEE International SOI Conference, Oct. 1996, pp. 136-137.

Matsuoka et al., FBC Potential of 6F2 Single Cell Operation in Multi Gbit Memories Confirmed by a Newly Developed Method for Measuring Signal Sense Margin, 2007, IEDM.

Minami, A Floating Body Cell (FBC) fully Compatible with 90nm CMOS Technology(CMOS IV) for 128Mb SOI DRAM, 2005, IEDM.

Mohapatra et al., Effect of Source/Drain Asymmetry on the Performance of Z-RAMÒ Devices, Oct. 2009, SOI conference.

Morishita, A Capacitorless Twin-Transistor Random Access Memory (TTRAM) on SOI 2005, CICC.

Morishita, F. et al., "A Configurable Enhanced TTRAM Macro for System-Level Power Management Unified Memory", IEEE Journal of Solid-State Circuits, vol. 42, No. 4, pp. 853, Apr. 2007.

Morishita, F., et al., "A 312-MHz 16-Mb Random-Cycle Embedded DRAM Macro With a Power-Down Data Retention Mode for Mobile Applications", J. Solid-State Circuits, vol. 40, No. 1, pp. 204-212, 2005.

Morishita, F., et al., "Dynamic floating body control SOI CMOS for power managed multimedia ULSIs", Proc. CICC, pp. 263-266, 1997.

Morishita, F., et al., "Leakage Mechanism due to Floating Body and Countermeasure on Dynamic Retention Mode of SOI-DRAM", Symposium on VLSI Technology Digest of Technical Papers, pp. 141-142, 1995.

Nagoga, Studying of Hot Carrier Effect in Floating Body Soi Mosfets by the Transient Charge Pumping Technique, Switzerland 2003.

Nayfeh, A Leakage Current Model for SOI based Floating Body Memory that Includes the Poole-Frenkel Effect, 2008, SOI Conference.

Nemati, A Novel High Density, Low Voltage SRAM Cell with a Vertical NDR Device, 1998, VLSI Tech. Symp.

Nemati, A Novel Thyristor-based SRAM Cell (T-RAM) for High-Speed, Low-Voltage, Giga-scale Memories, 1999, IEDM Conference.

Nemati, Embedded Volatile Memories-Embedded Tutorial: The New Memory Revolution, New Drives Circuits and Systems, ICCAD 2008, Nov. 2008.

Nemati, Fully Planar 0.562µm2 T-RAM Cell in a 130nm SOI CMOS Logic Technology for High-Density High-Performance SRAMs, 2004, IEDM.

Nemati, The New Memory Revolution. New Devices, Circuits and Systems, 2008, ICCAD.

Nemati, Thyristor RAM (T-RAM): A High-Speed High-Density Embedded Memory Technology for Nano-scale CMOS, 2007, Hot Chips.

Nemati, Thyristor-RAM: A Novel Embedded Memory Technology that Outperforms Embedded S RAM/DRAM, 2008, Linley Tech Tour.

Nishiguchi et al., Long Retention of Gain-Cell Dynamic Random Access Memory with Undoped Memory Node, 2007, IEEE EDL.

Oh, Floating Body DRAM Characteristics of Silicon-On-ONO (SOONO) Devices for System-on-Chip (SoC) Applications, 2007, VLSI Symposium.

Ohno et al., "Suppression of Parasitic Bipolar Action in Ultra-Thin-Film Fully-Depleted CMOS/SIMOX Devices by Ar-Ion Implantation into Source/Drain Regions", IEEE Transactions on Electron Devices, vol. 45, No. 5, May 1998, pp. 1071-1076.

Ohsawa et al., "A Memory Using One-Transistor Gain Cell on SOI (FBC) with Performance Suitable for Embedded DRAM's", 2003 Symposium on VLSI Circuits Digest of Technical Papers, Jun. 2003 (4 pages).

Ohsawa et al., "Memory Design Using a One-Transistor Gain Cell on SOI", IEEE Journal of Solid-State Circuits, vol. 37, No. 11, Nov. 2002, pp. 1510-1522.

Ohsawa, A 128Mb Floating Body RAM (FBRAM) on SOI with a Multi-Averaging Scheme of Dummy Cell, 2006 Symposium of VLSI Circuits Digest of Tech Papers, (2006).

Ohsawa, An 18.5ns 128Mb SOI DRAM with a Floating Body Cell, 2005, ISSCC.

Ohsawa, Autonomous Refresh of Floating Body Cell (FBC), Dec. 2008, IEDM.

Ohsawa, Design of a 128-Mb SOI DRAM Using the Floating Body Cell (FBC), Jan. 2006, Solid-State Circuits.

Okhonin, A Capacitor-Less 1T-DRAM Cell, Feb. 2002, Electron Device Letters.

Okhonin, A SOI Capacitor-less 1T-DRAM Concept, 2001, SOI Conference.

Okhonin, Charge Pumping Effects in Partially Depleted SOI MOSFETs, 2003, SOI Conference.

Okhonin, New characterization techniques for SOI and related devices, 2003, ECCTD.

Okhonin, New Generation of Z-RAM, 2007, IEDM.

Okhonin, Principles of Transient Charge Pumping on Partially Depleted SOI MOSFETs, May 2002, Electron Device Letters.

Okhonin, Transient Charge Pumping for Partially and Fully Depleted SOI MOSFETs, 2002, SOI Conference.

Okhonin, Transient effects in PD SOI MOSFETs and potential DRAM applications, 2002, Solid-State Electronics.

Okhonin, Ultra-scaled Z-RAM cell, 2008, SOI Conference.

Okhonin, Z-RAM® (Limits of DRAM), 2009, ESSDERC.

Padilla, Alvaro, et al., "Feedback FET: A Novel Transistor Exhibiting Steep Switching Behavior at Low Bias Voltages," Electron Devices Meeting, 2008. IEDM 2008. IEEE International, Dec. 5-17, 2008.

Park, Fully Depleted Double-Gate 1T-DRAM Cell with NVM Function for High Performance and High Density Embedded DRAM, 2009, IMW.

Pelella et al., "Low-Voltage Transient Bipolar Effect Induced by Dynamic Floating-Body Charging in PD/SOI MOSFETs", Final Camera Ready Art, SOI Conference, Oct. 1995, 2 pages.

Portmann et al., "A SOI Current Memory for Analog Signal Processing at High Temperature", 1999 IEEE International SOI Conference, Oct. 1999, pp. 18-19.

Puget et al., 1T Bulk eDRAM using GIDL Current for High Speed and Low Power applications, 2008, SSDM.

Puget et al., Quantum effects influence on thin silicon film capacitor-less DRAM performance, 2006, SOI Conference.

Puget, FDSOI Floating Body Cell eDRAM Using Gate-Induced Drain-Leakage (GIDL) Write Current for High Speed and Low Power Applications, 2009, IMW.

Ranica et al., 1T-Bulk DRAM cell with improved performances: the way to scaling, 2005, ICMTD.

Ranica, A capacitor-less DRAM cell on 75nm gate length, 16nm thin Fully Depleted SOI device for high density embedded memories, 2004, IEDM.

Ranica, A One Transistor Cell on Bulk Substrate (1T-Bulk) for Low-Cost and High Density eDRAM, 2004, VLSI Symposium.

Rodder et al., "Silicon-On-Insulator Bipolar Transistors", IEEE Electron Device Letters, vol. EDL-4, No. 6, Jun. 1983, pp. 193-195.

Rodriguez, Noel, et al., A-RAM Novel Capacitor-less DRAM Memory, SOI Conference, 2009 IEEE International, Oct. 5-8, 2009 pp. 1-2.

Roy, Thyristor-Based Volatile Memory in Nano-Scale CMOS, 2006, ISSCC.

Salling et al., Reliability of Thyristor Based Memory Cells, 2009, IRPS.

Sasaki et al., Charge Pumping in SOS-MOS Transistors, 1981, IEEE Trans. On El. Dev.

Sasaki et al., Charge Pumping SOS-MOS Transistor Memory, 1978, IEDM.

Schloesser et al., "A 6F2 Buried Wordline DRAM Cell for 40nm and Beyond", IEEE, Qimonda Dresden GmbH & Co., pp. 809-812 (2008).

Shino et al., Floating Body RAM technology and its scalability to 32 nm node and beyond, 2006, IEDM.

Shino et al., Operation Voltage Dependence of Memory Cell Characteristics in Fully Depleted FBC, 2005, IEEE Trans. On El. Dev.

Shino, Fully-Depleted FBC (Floating Body Cell) with Enlarged Signal Window and Excellent Logic Process Compatibility, 2004, IEDM.

Shino, Highly Scalable FBC (Floating Body Cell) with 25nm BOX Structure for Embedded DRAM Applications, 2004, VLSI Symposium.

Sim et al., "Source-Bias Dependent Charge Accumulation in P+-Poly Gate SOI Dynamic Random Access Memory Cell Transistors", Jpn. J. Appl. Phys. vol. 37 (1998) pp. 1260-1263, Part 1, No. 3B, Mar. 1998.

Singh, A 2ns-Read-Latency 4Mb Embedded Floating-Body Memory Macro in 45nm SOI Technology, Feb. 2009, ISSCC.

Sinha et al., "In-Depth Analysis of Opposite Channel Based Charge Injection in SOI MOSFETs and Related Defect Creation and Annihilation", Elsevier Science, Microelectronic Engineering 28, 1995, pp. 383-386.

Song, 55 nm Capacitor-less 1T DRAM Cell Transistor with Non-Overlap Structure, Dec. 2008, IEDM.

Stanojevic et al., "Design of a SOI Memory Cell", IEEE Proc. 21st International Conference on Microelectronics (MIEL '97), vol. 1, NIS, Yugoslavia, Sep. 14-17, 1997, pp. 297-300.

Su et al., "Studying the Impact of Gate Tunneling on Dynamic Behaviors of Partially-Depleted SOI CMOS Using BSIMPD", IEEE Proceedings of the International Symposium on Quality Electronic Design (ISQED '02), Apr. 2002 (5 pages).

Suma et al., "An SOI-DRAM with Wide Operating Voltage Range by CMOS/SIMOX Technology", 1994 IEEE International Solid-State Circuits Conference, pp. 138-139.

Tack et al., "The Multi-Stable Behaviour of SOI-NMOS Transistors at Low Temperatures", Proc. 1988 SOS/SOI Technology Workshop (Sea Palms Resort, St. Simons Island, GA, Oct. 1988), p. 78.

Tack et al., "The Multistable Charge Controlled Memory Effect in SOI Transistors at Low Temperatures", IEEE Workshop on Low Temperature Electronics, Aug. 7-8, 1989, University of Vermont, Burlington, pp. 137-141.

Tack et al., "The Multistable Charge-Controlled Memory Effect in SOI MOS Transistors at Low Temperatures", IEEE Transactions on Electron Devices, vol. 37, No. 5, May 1990, pp. 1373-1382.

Tack, et al., "An Analytical Model for the Misis Structure in SOI MOS Devices", Solid-State Electronics vol. 33, No. 3, 1990, pp. 357-364.

Tanaka et al., "Scalability Study on a Capacitorless 1T-DRAM: From Single-gate PD-SOI to Double-gate FINDRAM", 2004 IEEE, 4 pages.

Tang, Poren, Highly Scalable Capacitorless DRAM Cell on Thin-Body with Band-gap Engineered Source and Drain, Extended Abstracts of the 2009 ICSSDM, Sendai, 2009, pp. 144-145.

Terauchi et al., "Analysis of Floating-Body-Induced Leakage Current in 0.15µm SOI DRAM", Proceedings 1996 IEEE International SOI Conference, Oct. 1996, pp. 138-139.

Thomas et al., "An SOI 4 Transistors Self-Refresh Ultra-Low-Voltage Memory Cell", IEEE, Mar. 2003, pp. 401-404.

Tomishima, et al., "A Long Data Retention SOI DRAM with the Body Refresh Function", IEICE Trans. Electron., vol. E80-C, No. 7, Jul. 1997, pp. 899-904.

Tsaur et al., "Fully Isolated Lateral Bipolar-MOS Transistors Fabricated in Zone-Melting-Recrystallized Si Films on SiO2", IEEE Electron Device Letters, vol. EDL-4, No. 8, Aug. 1983, pp. 269-271.

Tu, et al., "Simulation of Floating Body Effect in SOI Circuits Using BSIM3SOI", Proceedings of Technical Papers (IEEE Cat No. 97TH8303), Jun. 1997, pp. 339-342.

Villaret et al., "Mechanisms of Charge Modulation in the Floating Body of Triple-Well nMOSFET Capacitor-less DRAMs", Proceedings of the INFOS 2003, Insulating Films on Semiconductors, 13th Bi-annual Conference, Jun. 18-20, 2003, Barcelona (Spain), (4 pages).

Villaret et al., "Triple-Well nMOSFET Evaluated as a Capacitor-Less DRAM Cell for Nanoscale Low-Cost & High Density Applications", Handout at Proceedings of 2003 Silicon Nanoelectronics Workshop, Jun. 8-9, 2003, Kyoto, Japan (2 pages).

Villaret et al., Further Insight into the Physics and Modeling of Floating Body Capacitorless DRAMs, 2005, IEEE Trans. On El. Dev.

Wang et al., A Novel 4.5F2 Capacitorless Semiconductor Memory Device, 2008, IEEE EDL.

Wann et al., "A Capacitorless DRAM Cell on SOI Substrate", IEEE IEDM, 1993, pp. 635-638.

Wann et al., "High-Endurance Ultra-Thin Tunnel Oxide in MONOS Device Structure for Dynamic Memory Application", IEEE Electron Device Letters, vol. 16, No. 11, Nov. 1995, pp. 491-493.

Wei, A., "Measurement of Transient Effects in SOI DRAM/SRAM Access Transistors", IEEE Electron Device Letters, vol. 17, No. 5, May 1996, pp. 193-195.

Wouters, et al., "Characterization of Front and Back Si-SiO2 Interfaces in Thick- and Thin-Film Silicon-on-Insulator MOS Structures by the Charge-Pumping Technique", IEEE Transactions on Electron Devices, vol. 36, No. 9, Sep. 1989, pp. 1746-1750.

Wu, Dake, "Performance Improvement of the Capacitorless DRAM Cell with Quasi-SOI Structure Based on Bulk Substrate," Extended Abstracts of the 2009 ICSSDM, Sendai, 2009, pp. 146-147.

Yamanaka et al., "Advanced TFT SRAM Cell Technology Using a Phase-Shift Lithography", IEEE Transactions on Electron Devices, vol. 42, No. 7, Jul. 1995, pp. 1305-1313.

Yamauchi et al., "High-Performance Embedded SOI DRAM Architecture for the Low-Power Supply", IEEE Journal of Solid-State Circuits, vol. 35, No. 8, Aug. 2000, pp. 1169-1178.

Yamawaki, M., "Embedded DRAM Process Technology", Proceedings of the Symposium on Semiconductors and Integrated Circuits Technology, 1998, vol. 55, pp. 38-43.

Yang, Optimization of Nanoscale Thyristors on SOI for High-Performance High-Density Memories, 2006, SOI Conference.

Yoshida et al., "A Design of a Capacitorless 1-T-DRAM Cell Using Gate-induced Drain Leakage (GIDL) Current for Low-Power and High-speed Embedded Memory", 2003 IEEE, 4 pages.

Yoshida et al., "A Study of High Scalable DG-FinDRAM", IEEE Electron Device Letters, vol. 26, No. 9, Sep. 2005, pp. 655-657.

Yoshida et al., A Capacitorless 1T-DRAM Technology Using GIDL Current for Low Power and High Speed Embedded Memory, 2006, IEEE Trans. On El. Dev.

Yu et al., Hot-Carrier Effect in Ultra-Thin-Film (UTF) Fully-Depleted SOI MOSFET's, 54th Annual Device Research Conference Digest (Cat. No. 96TH8193), Jun. 1996, pp. 22-23.

Yu et al., "Hot-Carrier-Induced Degradation in Ultra-Thin-Film Fully-Depleted SOI MOSFETs", Solid-State Electronics, vol. 39, No. 12, 1996, pp. 1791-1794.

Yu et al., "Interface Characterization of Fully-Depleted SOI MOSFET by a Subthreshold I-V Method", Proceedings 1994 IEEE International SOI Conference, Oct. 1994, pp. 63-64.

Yun et al., Analysis of Sensing Margin in SOONO Device for the Capacitor-less RAM Applications, 2007, SOI Conference.

Zhou, Physical Insights on BJT-Based 1T DRAM Cells, IEEE Electron Device Letters, vol. 30, No. 5, May 2009.

Ban et al., Integration of Back-Gate Doping for 15-nm Node Floating Body Cell (FBC) Memory, Components Research, Process Technology Modeling, presented in the 2010 VLSI Symposium on Jun. 17, 2010.

* cited by examiner

US 8,223,574 B2

TECHNIQUES FOR BLOCK REFRESHING A SEMICONDUCTOR MEMORY DEVICE

CROSS-REFERENCE TO RELATED APPLICATIONS

This patent application claims priority to U.S. Provisional Patent Application No. 61/111,665, filed Nov. 5, 2008, which is hereby incorporated by reference herein in its entirety.

FIELD OF THE DISCLOSURE

The present disclosure relates generally to semiconductor memory devices and, more particularly, to techniques for block refreshing a semiconductor memory device.

BACKGROUND OF THE DISCLOSURE

A semiconductor memory device may include arrays of memory cells. Each memory cell may include a transistor having an electrically floating body in which an amount of electrical charge is stored. The amount of electrical charge stored in the electrically floating body may represent a logic high (i.e., a binary "1" data state) or a logic low (i.e., a binary "0" data state). The amount of electrical charge stored in the electrically floating body may decay with time, and thus it may be necessary to restore the amount of electrical charge in the electrically floating body.

Various techniques may be employed to refresh a semiconductor memory device. In one technique, a data state may be read from and/or written back to a memory cell of the semiconductor memory device by applying suitable control signals. For example, current sense amplifier circuitry may be employed to read a data state of a memory cell. The current sense amplifier circuitry may compare a memory cell current with a reference current, such as for example, the current of a reference cell. The data state of the memory cell, for example, a logic high (i.e., a binary "1" data state) or a logic low (i.e., a binary "0" data state), may be determined based at least in part on the comparison between the memory cell current and the reference current.

After determining the data state of the memory cell, suitable control signals may be applied the memory cell in order to write back the determined data state. The suitable control signals employed for reading and/or writing back the data state may consume large amount of power. Also, the current sense amplifier circuitry employed to read and/or write back the data state may occupy large amount of space.

In addition, the current sense amplifier circuitry may sequentially address each row of memory cells to perform read and write operations. Typically, a refreshing process (e.g., reading and/or writing back a data state) may require 10 to 50 nanoseconds for each row and, depending on a number of rows in the semiconductor memory device, the refreshing process for the entire semiconductor memory device may require 10 to 50 milliseconds. Therefore, the refresh time period may limit the capacity of the semiconductor memory device.

Also, pulsing between positive and negative gate biases during current read and write operations may reduce a net quantity of charge carriers stored in an electrically floating body region of a memory cell within the semiconductor memory device, which, in turn, may gradually eliminate data stored in the memory cell. In the event that a negative voltage is applied to a gate of a memory cell transistor, thereby causing a negative gate bias, a channel of minority charge carriers beneath the gate may be eliminated. However, some of the minority charge carriers may remain "trapped" in interface defects. Some of the trapped minority charge carriers may recombine with majority charge carriers, which may be attracted to the gate, and net majority charge carriers located in the electrically floating body region may decrease over time. This phenomenon may be characterized as charge pumping, which is a problem because the net quantity of charge carriers may be reduced in the memory cell, which, in turn, may gradually eliminate data stored in the memory cell.

In view of the foregoing, it may be understood that there are significant problems and shortcomings associated with current techniques for refreshing semiconductor memory devices.

SUMMARY OF THE DISCLOSURE

Techniques for block refreshing a semiconductor memory device are disclosed. In one particular exemplary embodiment, the techniques may be realized as a method for block refreshing a semiconductor memory device. The method may comprise arranging a plurality of memory cells in one or more arrays of rows and columns. Each of the plurality of memory cells may comprise a first region coupled to a source line, a second region, a first body region disposed between the first region and the second region, wherein the body region may be electrically floating and charged to a first predetermined voltage potential, and a first gate coupled to a word line, wherein the first gate may be spaced apart from, and capacitively coupled to, the first body region. The method may also comprise applying voltage potentials to the plurality of memory cells to refresh a plurality of data states stored in the plurality of memory cells.

In accordance with other aspects of this particular exemplary embodiment, the plurality of data states stored in the plurality of memory cells may be refreshed in a single refresh cycle.

In accordance with further aspects of this particular exemplary embodiment, the plurality of data states may comprise a binary 0 data state and a binary 1 data state.

In accordance with additional aspects of this particular exemplary embodiment, wherein applying voltage potentials to the plurality of memory cells may further comprise a first voltage applied to the first region for the binary 0 data state and a second voltage applied to the first region for the binary 1 data state.

In accordance with other aspects of this particular exemplary embodiment, the first voltage may be lower than the second voltage.

In accordance with further aspects of this particular exemplary embodiment, wherein applying voltage potentials to the plurality of memory cells may further comprise a third voltage applied to the first gate for the binary 0 data state and a fourth voltage applied to the first gate for the binary 1 data state.

In accordance with additional aspects of this particular exemplary embodiment, the third voltage may be higher than the fourth voltage.

In accordance with yet another aspect of this particular exemplary embodiment, wherein applying voltage potentials to the plurality of memory cells may further comprise a fifth voltage applied to the second region for the binary 0 data state and a sixth voltage applied to the second region for the binary 1 data state.

In accordance with other aspects of this particular exemplary embodiment, the fifth voltage and the sixth voltage may be the same.

In accordance with further aspects of this particular exemplary embodiment, each of the plurality of memory cells may further comprise a third region coupled to the second region, a fourth region coupled to a bit line, a second body region disposed between the third region and the fourth region, wherein the second body region may be charged to a second predetermined voltage potential, and a second gate coupled to a control line spaced apart from, and capacitively coupled to, the second body region.

In accordance with additional aspects of this particular exemplary embodiment, the plurality of data states stored in the plurality of memory cells may be refreshed in a single refresh cycle.

In accordance with yet another aspect of this particular exemplary embodiment, the plurality of data states may comprise a binary 0 data state and a binary 1 data state.

In accordance with other aspects of this particular exemplary embodiment, wherein applying voltage potentials to the plurality of memory cells may further comprise a first voltage applied to the third region for the binary 0 data state and a third voltage applied to the first region for the binary 1 data state.

In accordance with further aspects of this particular exemplary embodiment, the first voltage may be same as the second voltage.

In accordance with additional aspects of this particular exemplary embodiment, wherein applying voltage potentials to the plurality of memory cells may further comprise a third voltage applied to the second gate for the binary 0 data state and a fourth voltage applied to the second gate for the binary 1 data state.

In accordance with other aspects of this particular exemplary embodiment, the third voltage may be higher than the fourth voltage.

In accordance with additional aspects of this particular exemplary embodiment, wherein applying voltage potentials to the plurality of memory cells may further comprise a fifth voltage applied to the second gate for the binary 0 data state and a sixth voltage applied to the second gate for the binary 1 data state.

In accordance with another aspect of this particular exemplary embodiment, the fifth voltage and the sixth voltage may be the same.

In accordance with other aspects of this particular exemplary embodiment, wherein applying voltage potentials to the plurality of memory cells may further comprise a seventh voltage applied to fourth region for the binary 0 data state and a eighth voltage applied to the fourth region for the binary 1 data state.

In accordance with further aspects of this particular exemplary embodiment, the seventh voltage may be higher than the eighth voltage.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

DETAILED DESCRIPTION OF EXEMPLARY EMBODIMENTS

There are many embodiments described and illustrated herein. In a first aspect, the present disclosure is directed to a semiconductor memory device and techniques for block refreshing the semiconductor memory device. In this regard, in one embodiment of this aspect of the present disclosure, techniques are disclosed for operating the semiconductor memory device to block refresh a logic high (i.e., a binary "1" data state) and a logic low (i.e., a binary "0" data state) in a single refresh cycle.

Figure 1:
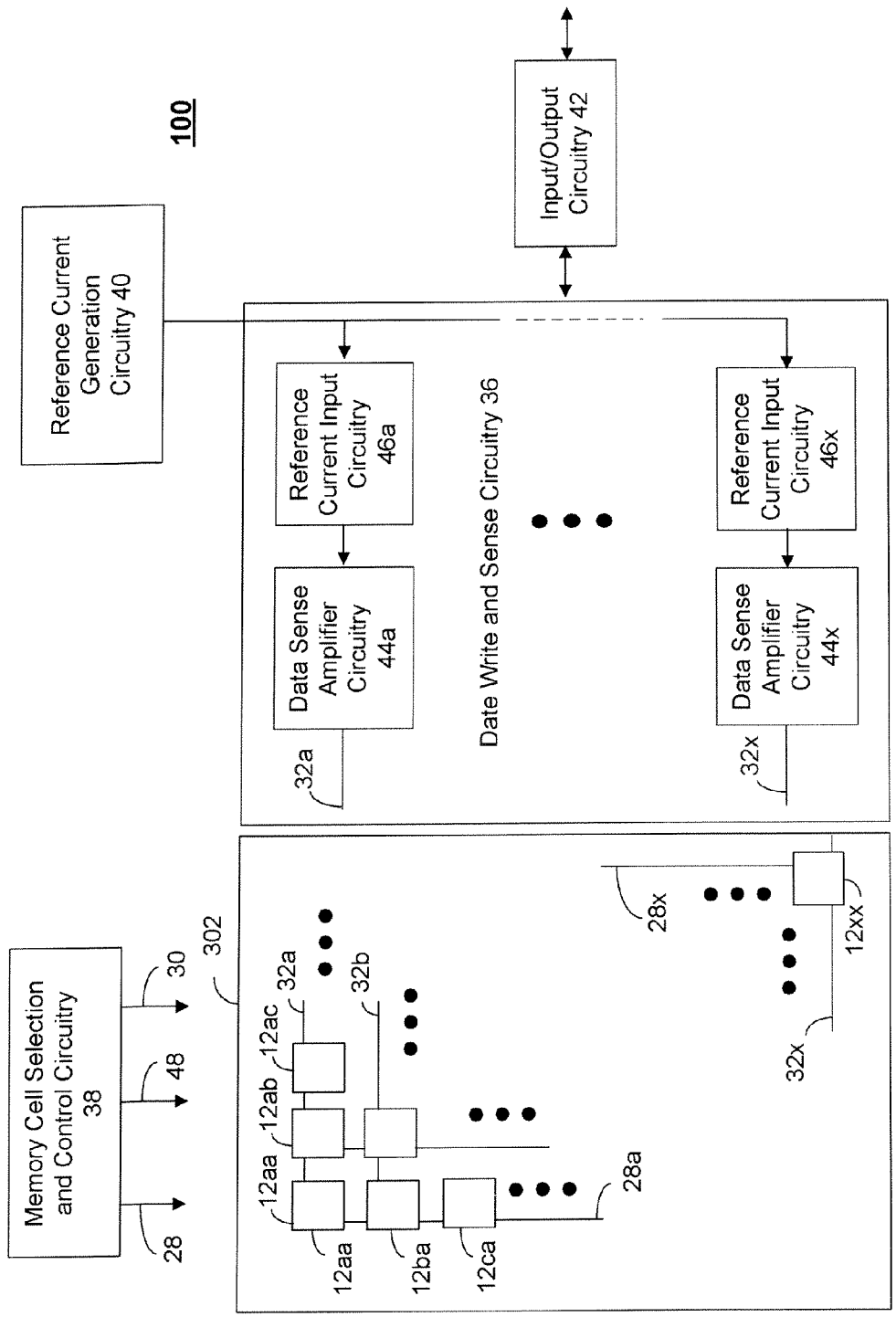
FIG. 1 shows schematic a block diagram of a semiconductor memory device in accordance with an embodiment of the present disclosure.

Referring to FIG. 1, there is shown a schematic block diagram of a semiconductor memory device 100 in accordance with an embodiment of the present disclosure. The semiconductor memory device 100 may include a memory cell array 302, data write and sense circuitry 36, memory cell selection and control circuitry 38, reference current generation circuitry 40, and input/output circuitry 42. The memory cell array 302 may include a plurality of memory cells 12 arranged in a matrix of rows and columns including a plurality of word lines 28 (WL), a plurality of source lines 30 (SL), a plurality of bit lines 32 (BL), and a plurality of control lines 48 (CL). The memory cell array 302 may be coupled to the memory cell selection and control circuitry 38 via the word lines 28 (WL), the source lines 30 (SL) and/or the control lines 48 (CL). Also, the memory cell array 302 may be coupled to the data write and sense circuitry 36 via the bit lines 32 (BL).

In an exemplary embodiment, the data write and sense circuitry 36 may include a plurality of data sense amplifier circuitry 44 and a plurality of reference current input circuitry 46. Each data sense amplifier circuitry 44 may be coupled to at least one bit line (BL) 32 and an output of reference current generator circuitry 40 (for example, a current or voltage reference signal) via a corresponding reference current input circuitry 46. For example, each data sense amplifier circuitry 44 may be a cross-coupled type of sense amplifier to detect, determine, sense, and/or sample a data state of a memory cell 12. Each data sense amplifier circuitry 44 may detect a data state of one or more memory cells 12 (e.g., along bit lines 32a-32x (BL)) by comparing voltages or currents on a bit line (BL) 32 with voltages or currents from the reference current generator circuitry 40. Also, each data sense amplifier circuitry 44 may apply a predetermined voltage to a bit line 32 (BL) based at least in part on a data state in a memory cell 12 as determined by the data sense amplifier circuitry 44 in order to write-back the data state to the memory cell 12.

The data sense amplifier circuitry 44 may employ voltage and/or current sensing circuitry and/or techniques. In an exemplary embodiment, the data sense amplifier circuitry 44 may employ current sensing circuitry and/or techniques. The current sense amplifier circuitry 44 may compare current from a selected memory cell 12 to a reference current from the reference current input circuitry 46 (e.g., current from one or more reference cells). From that comparison, it may be determined whether the memory cell 12 contained a logic high (i.e., a binary "1" data state) or a logic low (i.e., a binary "0" data state). It may be appreciated by one having ordinary skill in the art that any type or form of data write and sense circuitry 36 (including one or more sense amplifiers, using voltage or current sensing techniques, to sense the data state stored in a memory cell 12) may be employed to read data stored in memory cells 12 and/or write data to memory cells 12.

The memory cell selection and control circuitry 38 may select and/or enable one or more selected memory cells 12 to facilitate reading data therefrom and/or writing data thereto by applying control signals on one or more word lines 28 (WL), source lines 30 (SL), and/or control lines 48 (CL). The memory cell selection and control circuitry 38 may generate such control signals using address data (e.g., row address data). Moreover, the memory cell selection and control circuitry 38 may include a word line decoder and/or a driver (not shown). Thus, the memory cell selection and control circuitry 38 may include one or more different control/selection techniques (and circuitry therefor) to select and/or control memory cells 12.

Data may be written into one or more selected memory cells 12 of the semiconductor memory device 100 by applying suitable write control signals to one or more selected word lines 28 (WL), one or more selected source lines 30 (SL), one or more selected bit lines 32 (BL), and, in certain embodiments, as discussed in more detail below, one or more selected control lines 48 (CL). The memory cells 12 may exhibit (1) a first data state which is representative of a first amount of charge carriers in an electrically floating body region of a memory transistor, and (2) a second data state which is representative of a second amount of charge carriers in an electrically floating body region of a memory transistor. Additional data states are also possible.

In an exemplary embodiment, the write control signals may be applied to implement a two step write operation whereby all the memory cells 12 of a given row are written to a predetermined data state by first executing a "clear" operation, whereby all of the memory cells 12 of the given row may be written to a logic low (i.e., a binary "0" data state). Thereafter, selected memory cells 12 of the row may be selectively written to the predetermined data state (e.g., a logic high (i.e., a binary "1" data state)). The write control signals may also be applied to implement one step write operation whereby selective memory cells 12 of the selected row are selectively written to either a logic high (i.e., a binary "1" data state) or a logic low (i.e., a binary "0" data state) without first implementing a "clear" operation. The write control signals may include positive and/or negative signal levels, which may be constant or varying.

Data may be read from one or more selected memory cells 12 of the semiconductor memory device 100 by applying suitable read control signals to one or more selected word lines 28 (WL), one or more selected source lines 30 (SL), one or more selected bit lines 32 (BL), and, in certain embodiments, as discussed in more detail below, one or more selected control lines 48 (CL). As discussed above, a data state of a memory cell 12 may be read by comparing voltages or currents on a bit line (BL) 32 with reference voltages or currents in a respective data sense amplifier circuitry 44. The reference voltages or currents may be provided by the reference current generator circuitry 40 via a corresponding reference current input circuitry 46. From the comparison, it may be determined whether the memory cell 12 contained a logic high (i.e., a binary "1" data state) or a logic low (i.e., a binary "0" data state). Additional data states are also possible. The read control signals may include signals that cause, force, and/or induce a transistor current in the memory cell 12, which is representative of a data state of the memory cell 12. The read control signals may include positive and/or negative signal levels, which may be constant or varying.

Any of the exemplary writing, holding, and/or reading techniques described herein may be employed with the memory cell array 302. Exemplary voltage values for each of the control signals for a given operation (for example, writing, holding or reading) are discussed below in association with exemplary embodiments of the present disclosure.

Each memory cell 12 may comprise a memory transistor, which, in turn, may comprise an N-channel transistor, P-channel transistor, or a combination of both types of transistors. Also, circuitry that is peripheral to the memory cell array 302 (for example, sense amplifiers or comparators, row and column address decoders, as well as line drivers (not illustrated herein)) may include P-channel and/or N-channel type transistors. In the event that P-channel type transistors are employed as memory transistors in the memory cell(s) 12, suitable write and read voltages (e.g., negative voltages) may be employed. Conversely, in the event that N-channel type transistors are employed as memory transistors in the memory cell(s) 12, suitable write and read voltages (e.g., positive voltages) may be employed. Accordingly, for sake of brevity, this discussion will not be repeated.

Figure 2:
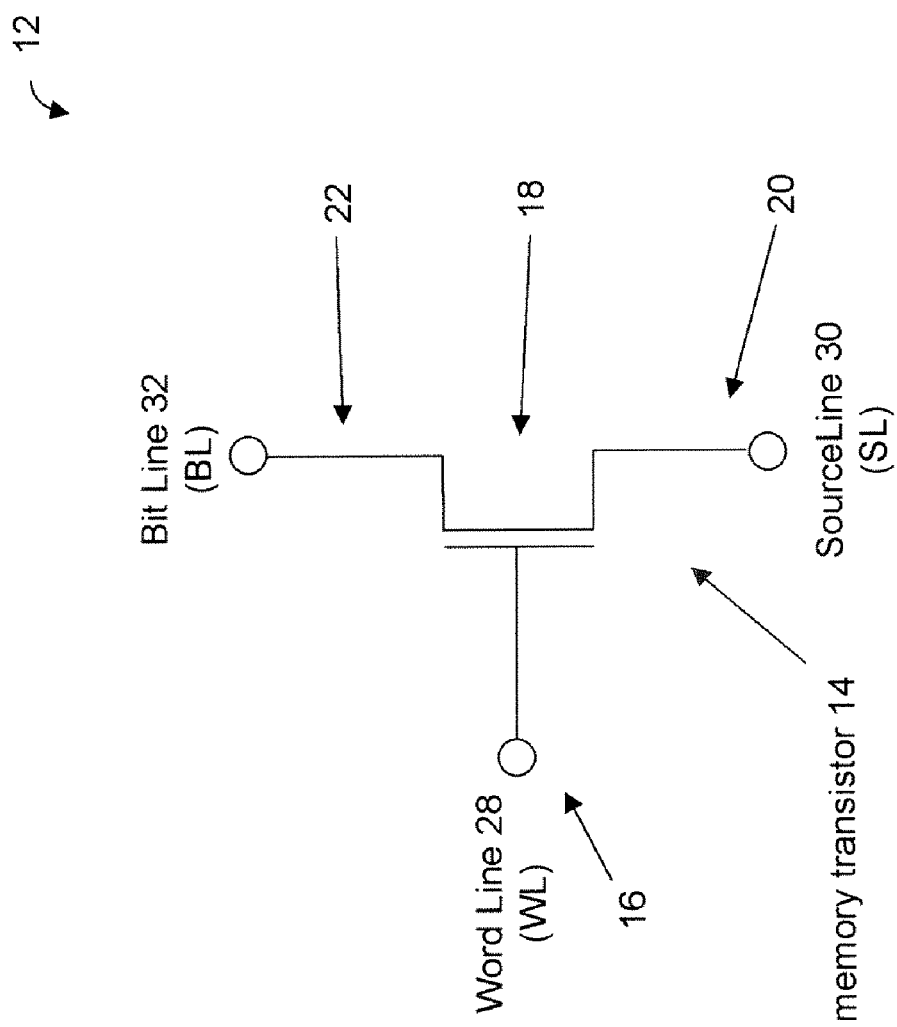
FIG. 2 shows an exemplary embodiment of a memory cell with a memory transistor in accordance with an embodiment of the present disclosure.

Referring to FIG. 2, there is shown an exemplary embodiment of a memory cell 12 having a memory transistor 14 in accordance with an embodiment of the present disclosure. The memory transistor 14 may include a source region 20, a drain region 22, and an electrically floating body region 18 disposed between the source region 20 and the drain region 22. Also, the memory transistor 14 may include a gate 16 disposed over the electrically floating body region 18. The source region 20 may be coupled to a source line 30 (SL), the gate 16 may be coupled to a word line 28 (WL), and the drain region 22 may be coupled to a bit line 32 (BL). In an exemplary embodiment, the source line 30 (SL), the word line 28 (WL), and/or the bit line 32 (BL) may be coupled to a variable voltage source (e.g., AC voltage source).

In this particular exemplary embodiment, data may be written into the memory cell 12 by applying suitable control signals to the word line 28, the source line 30, and/or the bit line 32. The memory cell 12 may exhibit (1) a first data state which is representative of a first amount of charge carriers in the electrically floating body region 18 of the memory transistor 14, and (2) a second data state which is representative of a second amount of charge carriers in the electrically floating body region 18 of the memory transistor 14. Additional data states are also possible.

In this particular exemplary embodiment, (i) first write control signals may be applied to the memory cell 12 to write the first data state therein and (ii) second write control signals may be applied to the memory cell 12 to write the second data state therein. In response to the first write control signals applied to the memory cell 12, the memory transistor 14 may generate a first transistor current which may substantially provide the first amount of charge carriers in the electrically floating body region 18 of the memory transistor 14. For example, the first amount of charge carriers present in the electrically floating body region 18 may represent a logic high (i.e., binary "1" data state) or a logic low (i.e., binary "0" data state). Additional data states are also possible.

The first write control signals may include a signal applied to the gate 16 and a signal applied to the source region 20, wherein the signal applied to the source region 20 may include a first voltage potential having a first amplitude and a second voltage potential having a second amplitude. In another exemplary embodiment, the first write control signals may include a signal applied to the gate 16 and a signal applied to the drain region 22, wherein the signal applied to the drain region 22 may include a third voltage potential having a third amplitude and a fourth voltage potential having a fourth amplitude.

Also, the second write signals may include a signal applied to the gate 16, a signal applied to the source region 20, and a signal applied to the drain region 22. The signal applied to the drain region 22 may include a block voltage potential to prevent the first data state and the second data state from being written into the memory transistor 14.

Figure 3A:
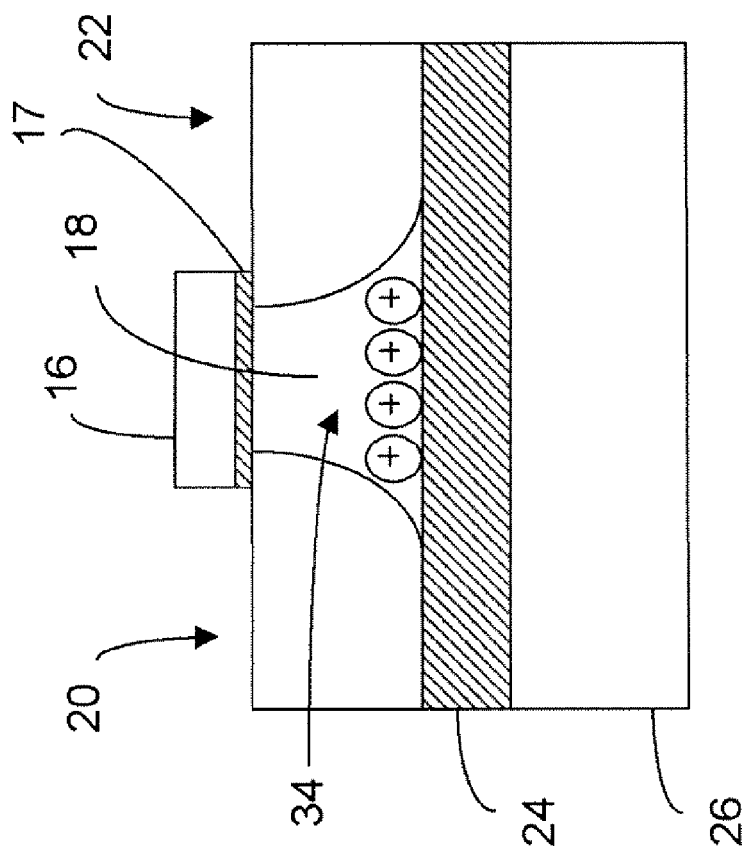
FIG. 3A shows a cross-sectional view of a memory transistor in accordance with an embodiment of the present disclosure.

Referring to FIG. 3A, there is a shown a cross-sectional view of a memory transistor 14 in accordance with an embodiment of the present disclosure. The memory transistor 14 (e.g., an N-channel type transistor or a P-channel type transistor) may include a source region 20, a drain region 22, and an electrically floating body region 18 disposed between the source region 20 and the drain region 22. Charge carriers 34 may be accumulated in or may be emitted/ejected from the electrically floating body region 18. A data state of the memory transistor 14 may be defined by an amount of charge carriers 34 present in the electrically floating body region 18.

The memory transistor 14 may also include a gate 16 disposed over the electrically floating body region 18. An insulating film 17 may be disposed between the gate 16 and the electrically floating body region 18. Moreover, the electrically floating body region 18 may be disposed on or above region 24, which may be an insulation region (e.g., in an SOI material/substrate) or a non-conductive region (e.g., in a bulk-type material/substrate). The insulation or non-conductive region 24 may be disposed on a substrate 26.

Figure 3B:
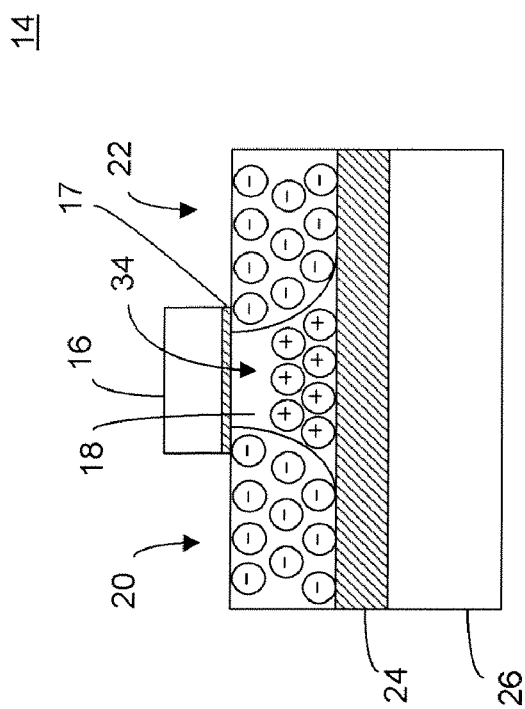
FIGS. 3B and 3C show charge relationships, for given data states, of a memory transistor in accordance with an embodiment of the present disclosure.
Figure 3C:
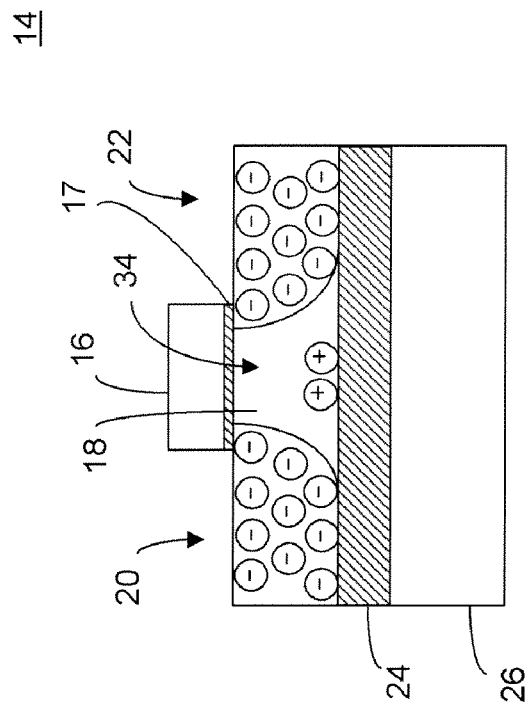

Referring to FIGS. 3B and 3C, there are shown charge relationships, for given data states, of the memory transistor 14 in accordance with an embodiment of the present disclosure. In an exemplary embodiment, the memory transistor 14 of each memory cell 12 may operate by accumulating or emitting/ejecting majority charge carriers 34 (e.g., electrons or holes) in/from the electrically floating body region 18. FIGS. 3B and 3C illustrate this with an N-Channel memory transistor 14. More specifically, various write techniques may be employed to accumulate majority charge carriers 34 (in this example, holes) in the electrically floating body region 18 of the memory transistor 14 by, for example, impact ionization near the source region 20 and/or drain region 22 (see FIG. 3B). Also, the majority charge carriers 34 may be emitted and/or ejected from the electrically floating body region 18 by, for example, forward biasing a junction between the source region 20 and the electrically floating body region 18 and/or a junction between the drain region 22 and the electrically floating body region 18 (see FIG. 3C).

As shown in FIG. 3B, a logic high (i.e., a binary "1" data state) may correspond to an increased concentration of majority charge carriers 34 in the electrically floating body region 18 relative to an unwritten memory transistor 14 and/or a memory transistor 14 that is written with a logic low (i.e., binary "0" data state). In contrast, as shown in FIG. 3C, a logic low (i.e., binary "0" data state) may correspond to a reduced concentration of majority charge carriers 34 in the electrically floating body region 18 relative to an unwritten memory transistor 14 and/or a memory transistor 14 that is written with a logic high (i.e., a binary "1" data state).

Figure 4:
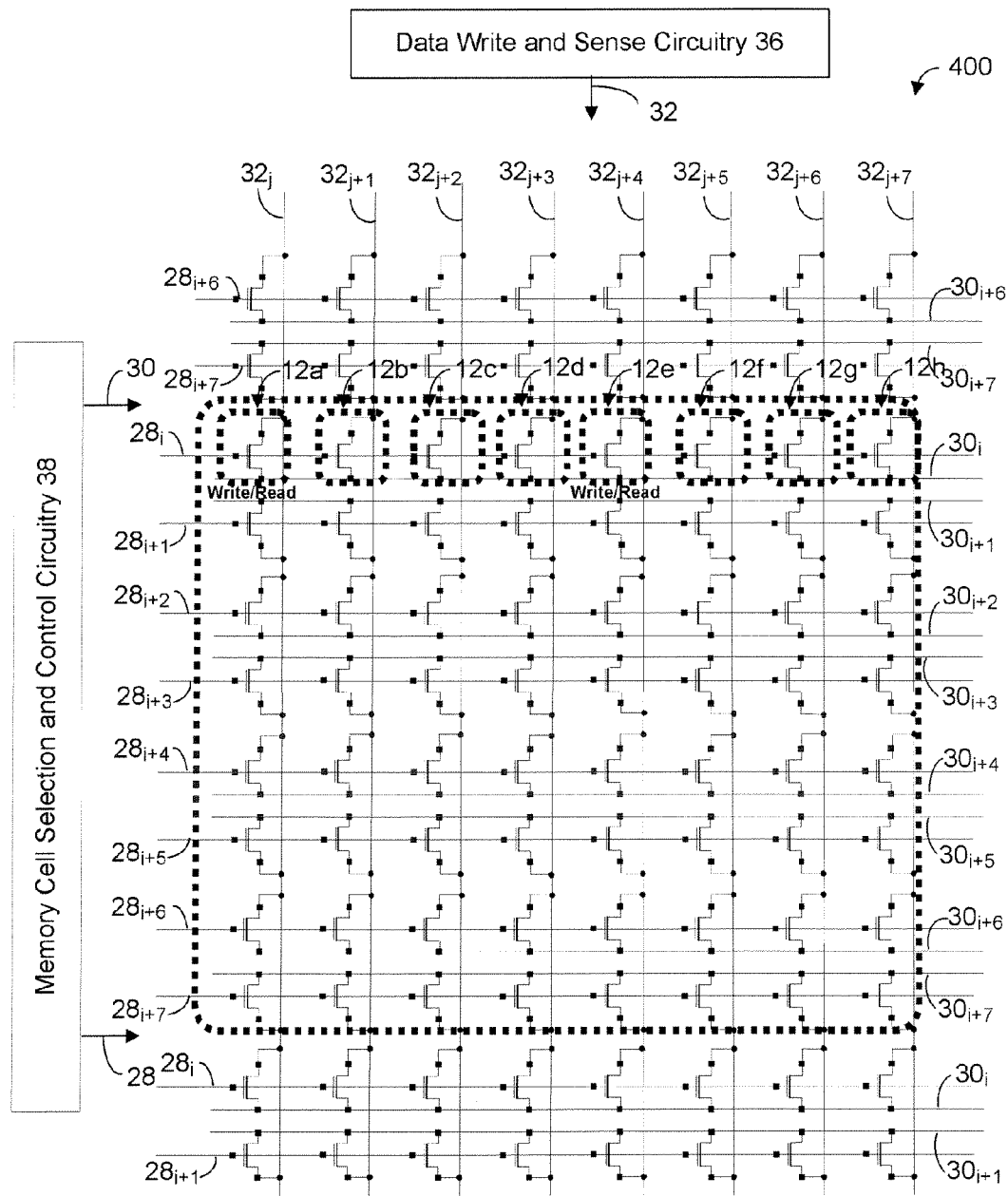
FIG. 4 shows an exemplary embodiment of a semiconductor memory device having a plurality of single transistor memory cells and a separate source line configuration in accordance with an embodiment of the present disclosure.

Referring to FIG. 4, there is shown an exemplary embodiment of a semiconductor memory device 400 having a plurality of single transistor memory cells 12 and a separate source line configuration in accordance with an embodiment of the present disclosure. The semiconductor memory device 400 may include a sub-array of memory cells 12 (for example, an 8×8 sub-array of memory cells 12 enclosed by the dotted line). The semiconductor memory device 400 may include data write and sense circuitry 36 coupled to a plurality of bit lines 32 (BL) of the plurality of memory cells 12 (for example, $32_j$, $32_{j+1}$, $32_{j+2}$, $32_{j+3}$, $32_{j+4}$, $32_{j+5}$, $32_{j+6}$, and $32_{j+7}$). Also, the semiconductor memory device 400 may include memory cell selection and control circuitry 38 coupled to a plurality of word lines 28 (WL) (for example, $28_i$, $28_{i+1}$, $28_{i+2}$, $28_{i+3}$, $28_{i+4}$, $28_{i+5}$, $28_{i+6}$, and $28_{i+7}$) and/or a plurality of source lines 30 (SL) (for example, $30_i$, $30_{i+1}$, $30_{i+2}$, $30_{i+3}$, $30_{i+4}$, $30_{i+5}$, $30_{i+6}$, and $30_{i+7}$).

As illustrated in FIG. 4, the sub-array of memory cells 12 may include eight rows by eight columns of memory cells 12. It may be appreciated by one skilled in the art that the size of the sub-array of memory cells 12 having a plurality of source lines (SL) may vary. For example, the sub-array of memory cells 12 may be a symmetrical sub-array including, but not limited to, four rows by four columns, sixteen rows by sixteen columns, thirty-two rows by thirty-two columns, sixty-four rows by sixty-four columns, etc. Also, the sub-array of memory cells 12 may be an asymmetrical sub-array including, for example, but not limited to, four rows by third-two columns, eight rows by four columns, sixteen rows by thirty-two columns, etc.

In an exemplary embodiment, memory cells 12 may be written to using a two step operation, wherein a given row of memory cells 12 may be written to a first predetermined data state by first executing a "clear" operation (which, in this exemplary embodiment, a selected row $28_i$ and/or all of the memory cells 12 of the given row are written or programmed to a logic low (i.e., a binary "0" date state)) and thereafter selected memory cells 12 may be written to a second predetermined data state (i.e., a selective write operation to the second predetermined data state).

In particular, a memory transistor 14 of each memory cell 12 of a given row (for example, memory cells 12a-12h) is controlled to store a majority charge carrier 34 concentration in the electrically floating body region 18 of the transistor 14 which corresponds to a logic low (i.e., a binary "0" data state). For example, control signals to implement a "clear" operation may be applied to the gate 16, the source region 20, and the drain region 22 of the memory transistor 14 of memory cells 12a-12h. In an exemplary embodiment, a "clear operation" may include applying (i) 1.5V to the gate 16, (ii) 0V to the source region 20, and (iii) 0V to the drain region 22 of the memory transistor 14. In response, the same logic state (for example, a logic low (i.e., a binary "0" data state)) may be stored in memory cells 12a-12h and the state of memory cells 12a-12h may be "cleared." For example, it may be preferable to maintain the gate-to-source voltage below the threshold voltage of the transistor of memory cell 12 to further minimize or reduce power consumption.

Thereafter, one or more selected memory cells 12 of a selected row (e.g., row associated with word line $28_i$ (WL)) may be written to the second predetermined logic state. For example, the memory transistors 14 of the one or more selected memory cells 12 of the selected row may be written to the second predetermined logic state in order to store the second predetermined logic state in the memory cells 12. For example, selected memory cells 12a and 12e may be written to a logic high (i.e., a binary "1" data state) (i.e., in selected row $28_i$ in FIG. 4), via an impact ionization effect and/or avalanche multiplication, by applying (i) −2.0V to the gate 16 (via word line $28_i$), (ii) −2.0V to the source region 20 (via source line $30_i$), and (iii) 1.5V to the drain region 22 (via bit line $32_j$ and $32_{j+4}$). Particularly, such control signals may generate or provide a bipolar current in the electrically floating body region 18 of the memory transistor 14 of the selected memory cells 12a and 12e. The bipolar current may cause or produce an impact ionization and/or avalanche multiplication phenomenon in the electrically floating body region 18 of the memory transistors 14 of the selected memory cells 12a and 12e. In this way, an excess of majority charge carriers 34 may be provided and stored in the electrically floating body region 18 of the memory transistor 14 of memory cells 12a and 12e which corresponds to a logic high (i.e., a binary "1" data state).

In an exemplary embodiment, memory cells 12b, 12c, 12d, 12f, 12g, and 12h (as shown in the selected row $28_i$) may be maintained at logic low (i.e., a binary "0" data state) by applying a voltage to inhibit impact ionization to the drain region 22 of the memory transistor 14 of each memory cell 12b, 12c, 12d, 12f, 12g, and 12h. For example, applying 1V to the drain regions 22 of the memory transistor 14 of memory cells 12b, 12c, 12d, 12f, 12g, and 12h (via bit lines $32_{j+1}$, $32_{j+2}$, $32_{j+3}$, $32_{j+5}$, $32_{j+6}$, and $32_{j+7}$) may inhibit impact ionization in memory cells 12b, 12c, 12d, 12f, 12g, and 12h during the selective write operation for memory cells 12a, and 12e.

Also, memory cells 12 (as shown in the selected row $28_i$) may be selectively written to a logic high (i.e., a binary "1" data state) using a band-to-band tunneling (GIDL) method. Band-to-band tunneling provides, produces and/or generates an excess of majority charge carriers 34 in the electrically floating body 18 of the memory transistors 14 of each selected memory cell 12 (in this exemplary embodiment, memory cells 12a and 12e). For example, after implementing the "clear" operation, memory cells 12a and 12e may be written to a logic high (i.e., a binary "1" data state), via band-to-band tunneling, by applying (i) −3V to the gate 16 (via word line $28_i$), (ii) −0.5V to the source region 20 (via source line $30_i$), and (iii) 1.0V to the drain region 22 (via bit line $32_j$ and $32_{j+4}$).

A selected row of memory cells 12 may be read by applying read control signals to the associated word line (WL) 28 and associated source lines (SL) 30 and sensing a signal (voltage and/or current) on associated bit lines (BL) 32. In an exemplary embodiment, memory cells 12a-12h (e.g., as shown in the selected row $28_i$) may be read by applying (i) −0.5V to the gate 16 (via word line $28_i$), (ii) 2.5V to the source region 20 (via source lines 30), and (iii) 0V to the drain region 22 (via bit lines 32). The data write and sense circuitry 36 may read the data state of the memory cells 12a-12h by sensing the response to the read control signals applied to word line 28, source line 30, and bit line 32. In response to the read control signals, memory cells 12a-12h may generate a bipolar transistor current which may be representative of the data state of memory cells 12a-12h. For example, memory cells 12a and 12e (which were earlier written to a logic high (i.e., a binary "1" data state)), in response to the read control signals, may generate a bipolar transistor current which is considerably larger than any channel current (e.g., current generated by memory cells 12 written to a logic low (i.e., a binary "0" data state)). In contrast, in memory cells 12b, 12c, 12d, 12f, 12g, and 12h (which were earlier programmed to a logic low (i.e., a binary "0" data state)), such control signals induce, cause, and/or produce little to no bipolar transistor current (for example, a considerable, substantial, or sufficiently measurable bipolar transistor current). The circuitry in data write and sense circuitry 36 to sense the data state (for example, a cross-coupled sense amplifier) may sense the data state using primarily and/or based substantially on the bipolar transistor current.

Thus, in response to read control signals, the memory transistor 14 of each memory cell 12a-12h may generate a bipolar transistor current which is representative of the data state stored therein. The circuitry in data write and sense circuitry 36 may determine the data state of memory cells 12a-12h based substantially on the bipolar transistor current induced, caused, and/or produced in response to the read control signals.

Figure 5:
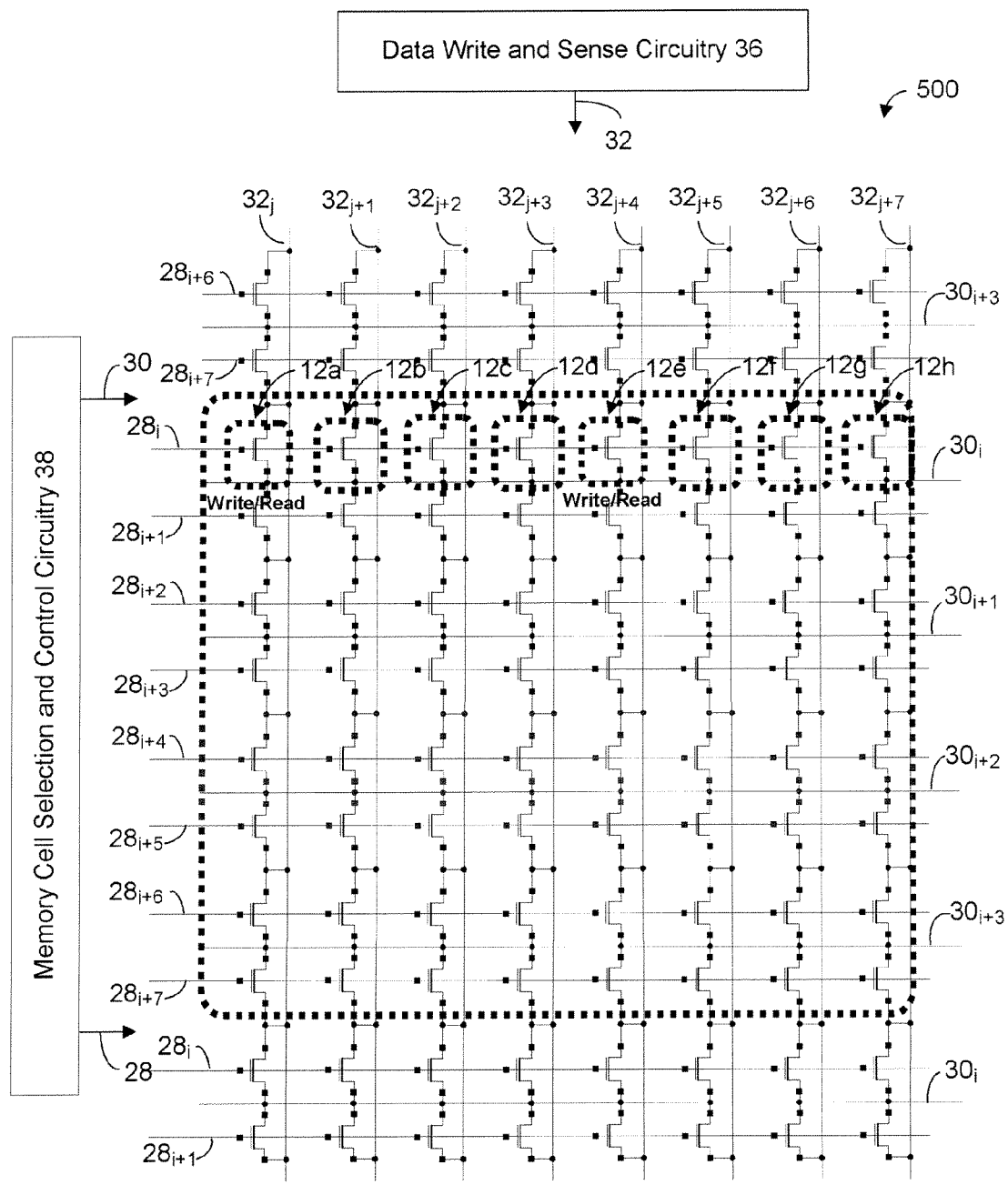
FIG. 5 shows an exemplary embodiment of a semiconductor memory device having a plurality of single transistor memory cells and a common source line configuration in accordance with an embodiment of the present disclosure.

Referring to FIG. 5, there is shown an exemplary embodiment of a semiconductor memory device 500 having a plurality of single transistor memory cells 12 and a common source line configuration in accordance with an exemplary embodiment of the present disclosure. As mentioned above, the present disclosure may be implemented in any memory array architecture having a plurality of memory cells 12 that employ memory transistors 14. Thus, as illustrated in FIG. 5, the semiconductor memory device 500 is configured having a common source line 30 (SL) for every two rows of memory cells 12 (a row of memory cells 12 includes a common word line 28 (WL)). The semiconductor memory device 500 may include a sub-array of memory cells 12 (for example, an 8×8 sub-array of memory cells 12 enclosed by the dotted line). The semiconductor memory device 500 may include data write and sense circuitry 36 coupled to one or more bit lines (BL) 32 (for example, $32_j$, $32_{j+1}$, $32_{j+2}$, $32_{j+3}$, $32_{j+4}$, $32_{j+5}$, $32_{j+6}$, and $32_{j+7}$). Also, the semiconductor memory device 500 may include memory cell selection and control circuitry 38 coupled to one or more word lines (WL) 28 (for example, $28_i$, $28_{i+1}$, $28_{i+2}$, $28_{i+3}$, $28_{i+4}$, $28_{i+5}$, $28_{i+6}$, and $28_{i+7}$) and/or one or more source lines (SL) 30 (for example, $30_i$, $30_{i+1}$, $30_{i+2}$, and $30_{i+3}$).

As illustrated in FIG. 5, the sub-array of memory cells 12 may include eight rows by eight columns of memory cells 12 having a plurality of source lines 30 (SL). It may be appreciated by one skilled in the art that the sub-array of memory cells 12 having the plurality of source lines 30 (SL) may vary. For example, the sub-array of memory cells 12 may be a sub-array including, but not limited to, four rows by four columns, sixteen rows by sixteen columns, thirty-two rows by thirty-two columns, sixty-four rows by sixty-four columns, etc.

An example (including exemplary control signal voltage values), according to certain aspects of the present disclosure, may be shown that consists of control signal waveforms and exemplary array voltages during a writing operation and/or a reading operation. For example, temporally varying control signals to implement a write operation may include (i) a voltage ($V_{sw}$) applied to a source region 20 of the memory transistor 14 via an associated source line 30 (SL), (ii) a voltage ($V_{gw}$) applied to a gate 16 of a memory transistor 14 via an associated word line 28 (WL), and (iii) a voltage ($V_{dw}$) applied to a drain region 22 of a memory transistor 14 via an associated bit line 32 (BL). Binary "1" or "0" data states may be written to one or more selected memory cells 12 by applying appropriate word line 28 (WL) voltages and/or bit line 32 (BL) voltages.

Figure 6:
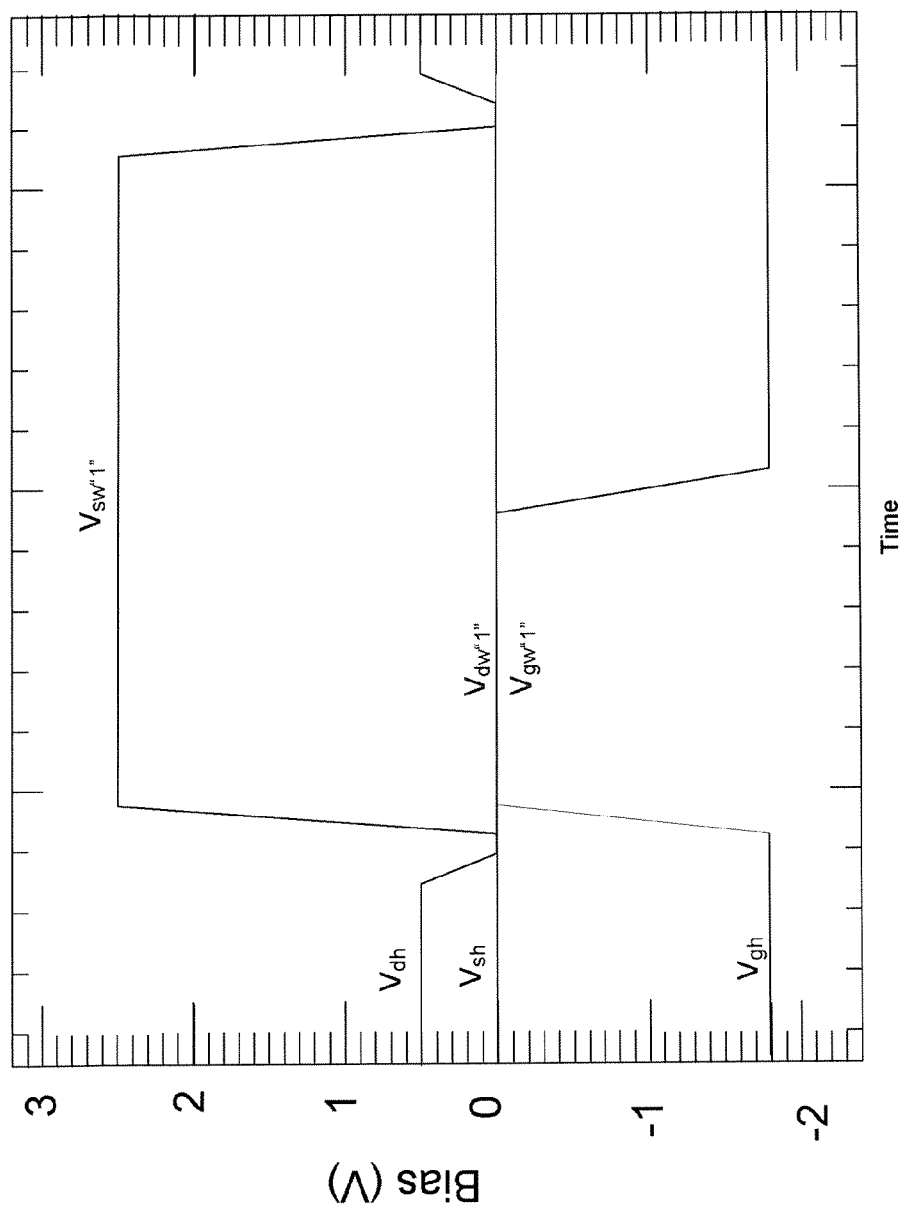
FIG. 6 shows a diagram of voltage control signals to implement a write operation for logic high (i.e., a binary "1" data state) into a memory cell with a single transistor in accordance with an embodiment of the present disclosure.

Referring to FIG. 6, there is shown a diagram of voltage control signals to implement a write operation for a logic high (i.e., a binary "1" data state) into a memory cell 12 in accordance with an exemplary embodiment of the present disclosure. The control signals may be configured to perform a one step write whereby selected memory cells 12 of a selected row of memory cells 12 may be selectively written or programmed to either a logic high (i.e., a binary "1" data state) or a logic low (i.e., a binary "0" date state) without first implementing a "clear" operation. For example, the temporally varying control signals to implement the write a logic high (i.e., a binary "1" data state) operation may include the voltage applied to the gate 16 ($V_{gw"1"}$), the voltage applied to the source region 20 ($V_{sw"1"}$), and the voltage applied to the drain region 22 ($V_{dw"1"}$). The logic high (i.e., a binary "1" data state) may be written to one or more selected memory cells 12 by applying appropriate word line 28 (WL) voltages and/or bit line 32 (BL) voltages. For example, a source voltage ($V_{sw"1"}$) of approximately 2.5V may be applied to the source region 20 (via, for example, the associated coupled source lines $30_i$, $30_{i+1}$, $30_{i+2}$, $30_{i+3}$, $30_{i+4}$, $30_{i+5}$, $30_{i+6}$, and $30_{i+7}$) and a drain voltage ($V_{dw"1"}$) of approximately 0.0V may be applied to the drain region 22 (via, for example, the associated selected bit line $32_j$, $32_{j+1}$, $32_{j+2}$, $32_{j+3}$, $32_{j+4}$, $32_{j+5}$, $32_{j+6}$, and $32_{j+7}$) of the memory transistor 14 before a gate voltage ($V_{gw"1"}$) of approximately 0.0V may be applied to the gate 16 (via, for example, the associated selected word line $28_i$, $28_{i+1}$, $28_{i+2}$, $28_{i+3}$, $28_{i+4}$, $28_{i+5}$, $28_{i+6}$, and $28_{i+7}$), simultaneously thereto, or after the gate voltage ($V_{gw"1"}$) is applied to gate 16. It is preferred that the drain voltage ($V_{dw"1"}$) include an amplitude which may be sufficient to maintain a bipolar current that is suitable for programming the memory cell 12 to a logic high (i.e., a binary "1" data state). From a relative timing perspective, it is preferred that the drain voltage ($V_{dw"1"}$) may extend beyond/after or continue beyond the conclusion of the gate voltage ($V_{gw"1"}$), or extend beyond/after or continue beyond the time the gate voltage ($V_{gw"1"}$) is reduced. Therefore, majority charge carriers may be generated in the electrically floating body region 18 via a bipolar current and majority charge carriers may accumulate (and be stored) in a portion of the electrically floating body region 18 of the memory transistor 14 of the memory cell 12 that may be juxtaposed or near the gate dielectric (which is disposed between the gate 16 and the electrically floating body region 18).

Figure 7:
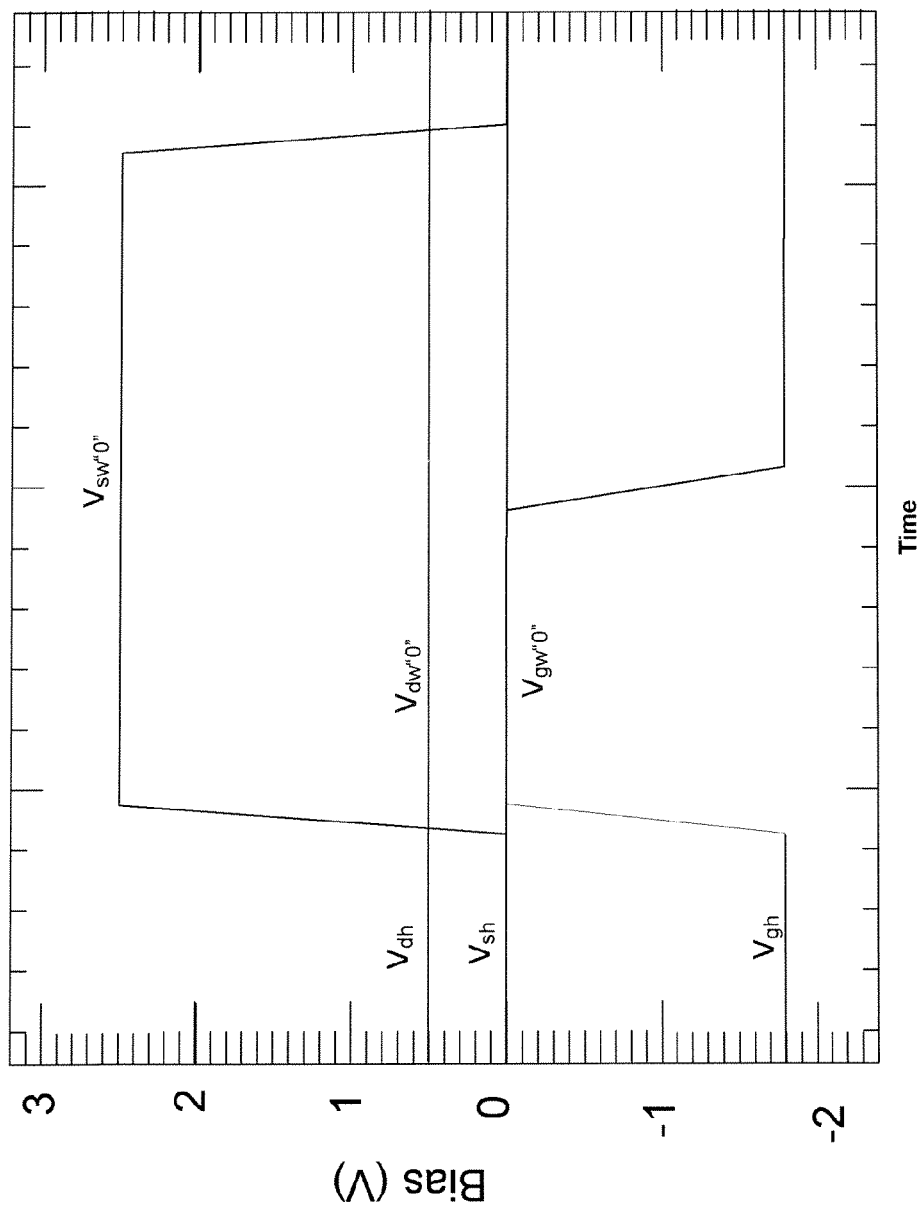
FIG. 7 shows a diagram of voltage control signals to implement a write operation for logic low (i.e., a binary "0" data state) into a memory cell with a single transistor in accordance with an embodiment of the present disclosure.

FIG. 7 shows a diagram of voltage control signals to implement a write operation for a logic low (i.e., a binary "0" data state) into a memory cell 12 in accordance with an embodiment of the present disclosure. The temporally varying control signals implemented to write a logic low (i.e., a binary "0" data state) may include a voltage applied to the gate 16 ($V_{gw"0"}$), a voltage applied to the source region 20 ($V_{sw"0"}$), and a voltage applied to the drain region 22 ($V_{dw"0"}$). For example, a source voltage ($V_{sw"0"}$) of approximately 2.5V may be applied to the source region 20 (via, for example, the coupled source lines $30_i$, $30_{i+1}$, $30_{i+2}$, $30_{i+3}$, $30_{i+4}$, $30_{i+5}$, $30_{i+6}$, and $30_{i+7}$) and a drain voltage ($V_{dw"0"}$) of approximately 0.5V may be applied to the drain region 22, may be applied before a gate voltage ($V_{gw"0"}$) of approximately 0.0V is applied to the gate 16, or simultaneously thereto, or after the gate voltage ($V_{gw"0"}$) is applied to the gate 16. Particularly, the source to drain voltage ($V_{Sw"0"} - V_{dw"0"}$) may include an amplitude which may be insufficient to maintain a bipolar current that is suitable for writing the memory cell 12 to a logic high (i.e., a binary "1" data state). From a relative timing perspective, it may be preferred that the drain voltage ($V_{dw"0"}$) may extend beyond/after or continue beyond the conclusion of the gate voltage ($V_{gw"0"}$) or extend beyond/after or continue beyond the time the gate voltage ($V_{gw"0"}$) is reduced. For example, majority charge carriers 34 may be generated in the electrically floating body region 18 via a bipolar current and majority charge carriers may be accumulated (and be stored) in a portion of the electrically floating body region 18 of the memory transistor 14 of the memory cell 12 that is juxtaposed or near the gate dielectric (which is disposed between the gate 16 and the electrically floating body region 18).

Figure 8:
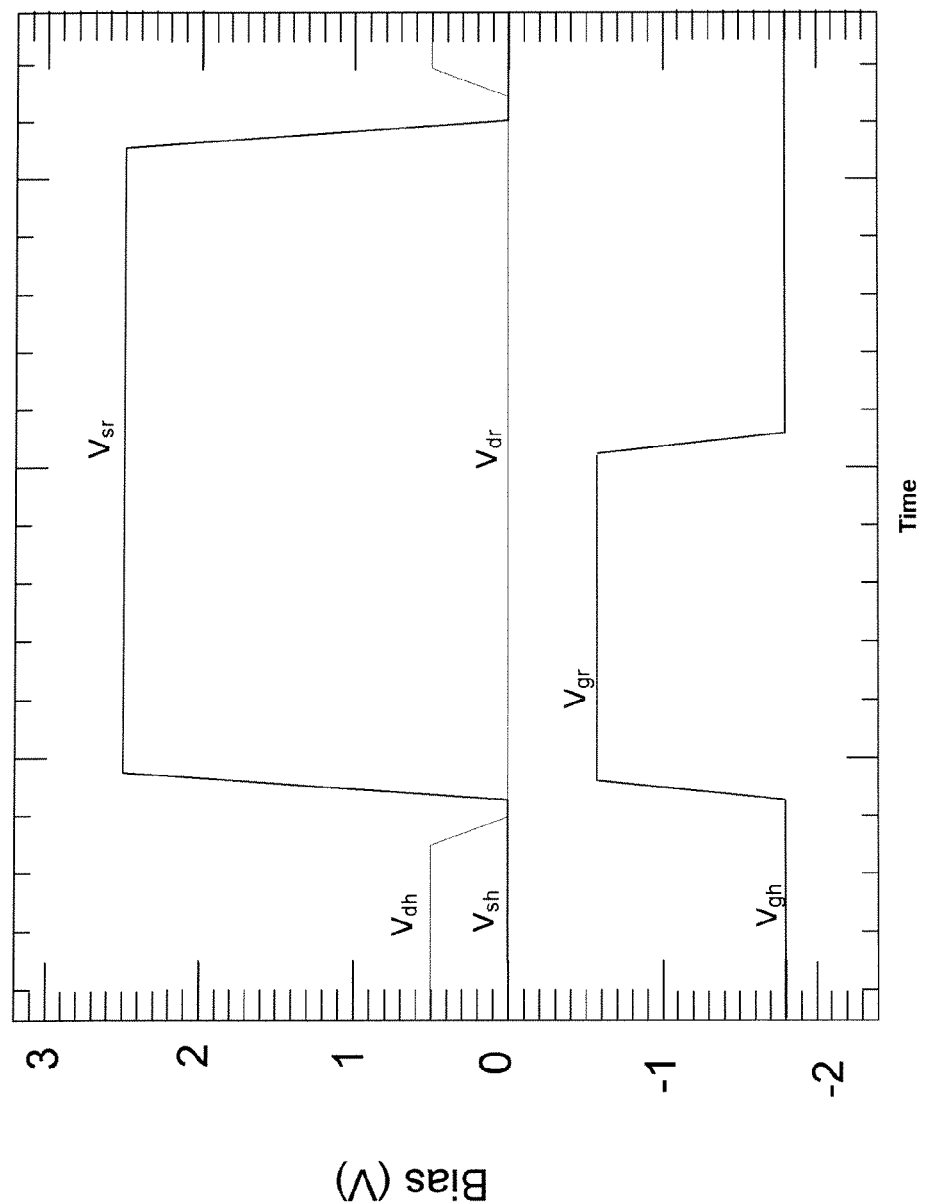
FIG. 8 shows a diagram of voltage control signals to implement a read operation of a memory cell with a single transistor in accordance with an embodiment of the present disclosure.

FIG. 8 shows a diagram of voltage control signals to implement a read operation of a memory cell 12 in accordance with an embodiment of the present disclosure. For example, read control signals may be applied to the gate 16, the source region 20, and the drain region 22. A source voltage ($V_{sr}$) of approximately 2.5V may be applied to the source region 20 and a drain voltage ($V_{dr}$) of approximately 0.0V may be applied to the drain region 22, before application of a gate voltage ($V_{gr}$) of approximately −0.5V to the gate 16, simultaneously thereto, or after the gate voltage ($V_{gr}$) is applied to the gate 16. Further, the drain voltage ($V_{dr}$) may extend beyond/after or continue beyond the conclusion of the gate voltage ($V_{gr}$), simultaneously thereto (as illustrated in FIG. 8), or before the gate voltage ($V_{gr}$) may conclude or cease.

In an exemplary embodiment, during the read operation, a bipolar current is generated in memory cells 12 storing a logic high (i.e., a binary "1" data state) and little to no bipolar current is generated in memory cells 12 storing a logic low (i.e., a binary "0" data state). The data state may be determined primarily by, sensed substantially using and/or based substantially on the bipolar transistor current that is responsive to the read control signals and significantly less by the interface channel current component, which is less significant and/or negligible relatively to the bipolar component.

The writing and reading techniques described herein may be employed in conjunction with a plurality of memory cells 12 arranged in an array of memory cells 12. A memory array implementing the structure and techniques of the present disclosures may be controlled and configured including a plurality of memory cells 12 having a source line (SL) for each row of memory cells 12. The exemplary layouts or configurations (including exemplary control signal voltage values), in accordance to one or more exemplary embodiments of the present disclosure are shown, each consisting of the control signal waveforms and exemplary array voltages during one-step writing and reading.

Accordingly, the illustrated/exemplary voltage levels to implement the write and read operations are merely exemplary. The indicated voltage levels may be relative or absolute. Alternatively, the voltages indicated may be relative in that each voltage level, for example, may be increased or decreased by a given voltage amount (e.g., each voltage may be increased or decreased by 0.5V, 1.0V and 2.0V) whether one or more of the voltages (e.g., the source region voltage, the drain region voltage or gate voltage) become or are positive and negative.

Figure 9:
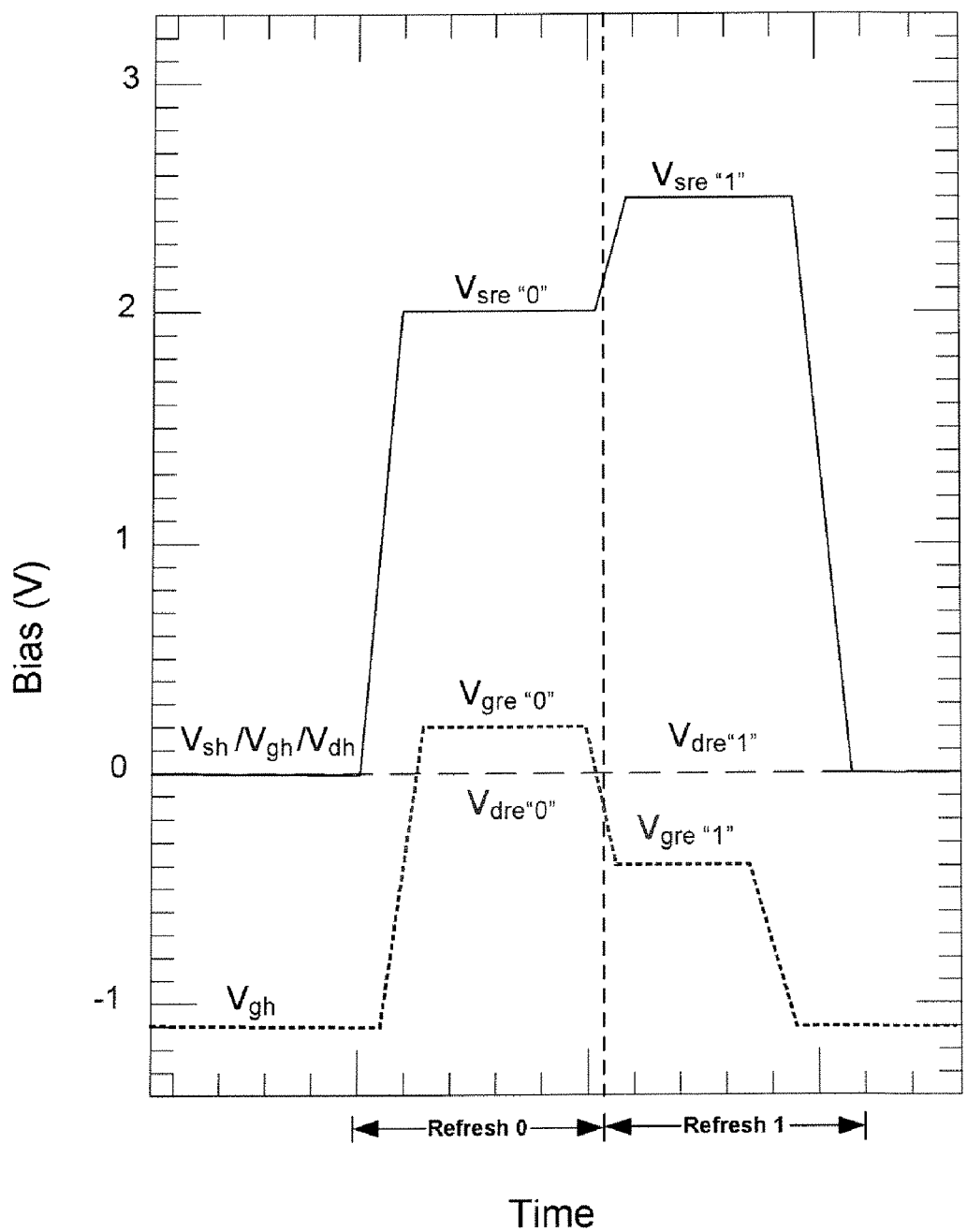
FIG. 9 shows a diagram of voltage control signals to implement a refresh operation of a memory cell with a single transistor in accordance with an embodiment of the present disclosure.

FIG. 9 shows a diagram of voltage control signals to implement a refresh operation of a memory cell 12 with a single transistor in accordance with an embodiment of the present disclosure. The application of the temporally varying control signals may implement a block refresh operation of a logic high (i.e., a binary "1" data state) and a logic low (i.e., a binary "0" data state) in a single block refresh cycle. For example, the block refresh cycle may include a logic low (i.e., a binary "0" data state) block refresh phase and a logic high (i.e., a binary "1" data state) block refresh phase. In an exemplary embodiment, block refresh control signals may be applied to the source region 20, the gate 16, and the drain region 22 of the memory transistor 14 to refresh a logic high (i.e., a binary "1" data state) and/or a logic low (i.e., a binary "0" data state). During the logic low (i.e., a binary "0" data state) block refresh phase, a source voltage ($V_{sre\text{"}0\text{"}}$) of approximately 2.0V may be applied to the source region 20 of the memory transistor 14, a gate voltage ($V_{gre\text{"}0\text{"}}$) of approximately 0.2V may be applied to the gate 16 of the memory transistor 14, and a drain voltage ($V_{dre\text{"}0\text{"}}$) of approximately 0.0V may be applied to the drain region 22 of the memory transistor 14. The junction between the electrically floating body region 18 and the drain region 22 may become forward biased and an amount of majority charge carriers 34 (e.g., electrons or holes) may be removed from the electrically floating body region 18 of the memory transistor 14. The removal of the majority charge carriers 34 from the electrically floating body region 18 of the memory transistor 14 may refresh one or more memory cells 12 that may store a logic low (i.e., a binary "0" data state). In the event that the memory cells 12 may store a logic high (i.e., a binary "1" data state), an amount of majority charge carriers 34 may also be removed from the electrically floating body region 18 of the memory transistor 14. Thereafter, a logic high (i.e., a binary "1" data state) block refresh, as will be described below in detail, may be performed to restore the majority charge carriers 34 in the memory transistors 14 for a logic high (i.e., a binary "1" data state).

During the logic high (binary "1" date state) block refresh phase, a source voltage ($V_{sre\text{"}1\text{"}}$) of approximately 2.5V may be applied to the source region 20 of the memory transistor 14 and a gate voltage ($V_{gre\text{"}1\text{"}}$) of approximately −0.4V may be applied to the gate 16 of the memory transistor 14, and a drain voltage ($V_{dre\text{"}1\text{"}}$) of approximately 0.0V may be applied to the drain region 22 of the memory transistor 14. The temporally varying control signals (e.g., the source voltage ($V_{sre\text{"}1\text{"}}$), the gate voltage ($V_{gre\text{"}1\text{"}}$) and the drain voltage ($V_{dre\text{"}1\text{"}}$)) and/or an amount of majority charge carriers 34 accumulated in the electrically floating body region 18 of the memory transistor 14 (e.g., remaining after removal of an amount of majority charge carriers 34 performed by logic low (i.e., a binary "0" data state) block refresh phase) may trigger an impact ionization effect and/or avalanche multiplication in the memory transistor 14. The impact ionization effect and/or avalanche multiplication within the memory transistor 14 may replenish the majority charge carriers 34 accumulated in the electrically floating body region 18 of the memory transistor 14. In another exemplary embodiment, the memory transistors 14 that stores a logic low (i.e., a binary "0" data state), may not trigger into an impact ionization effect and/or avalanche multiplication because of insufficient amount of majority charge carriers 34 stored in the electrically floating body region 18 of the memory transistor 14.

As described in FIGS. 4 and 5, a plurality of memory transistors 14 may be coupled to the word lines 28 (WL) and/or the source lines 30 (SL). For example, by applying appropriate voltage potentials to the gate 16 and/or the source region 20 of the plurality of memory transistors 14 via the word line 28 (WL) and/or the source line 30 (SL), respectively, the plurality of memory transistors 14 may simultaneously perform the logic low (i.e., binary "0" data state) block refresh and/or the logic high (i.e., a binary "1" data state) block refresh.

Figure 10:
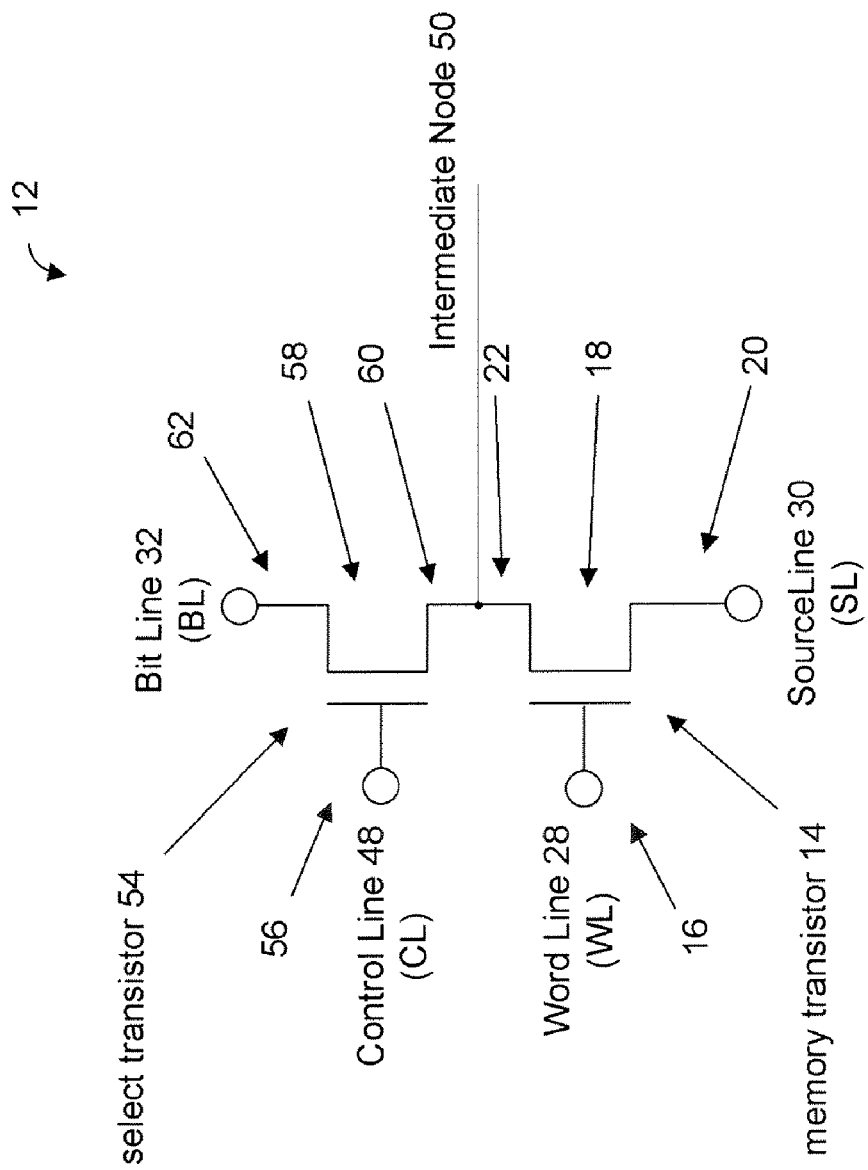
FIG. 10 shows an exemplary embodiment of a memory cell including a memory transistor and a select transistor in accordance with an embodiment of the present disclosure.

Referring to FIG. 10, there is shown an exemplary embodiment of a memory cell 12 including a memory transistor 14 and a select transistor 54 in accordance with an embodiment of the present disclosure. The memory transistor 14 may be coupled to the select transistor 54 via an intermediate node 50. As described above, the memory transistor 14 may include a source region 20, a drain region 22, and an electrically floating body region 18 disposed between the source region 20 and the drain region 22. Also, the memory transistor 14 may include a gate 16 disposed over the electrically floating body region 18. The select transistor 54 (e.g., an N-channel type transistor or a P-channel type transistor) may include a source region 60, a drain region 62, and an electrically floating body region 58 disposed between the source region 60 and the drain region 62. Also, the select transistor 54 may include a gate 56 disposed over the electrically floating body region 58. The memory transistor 14 and the select transistor 54 of each memory cell 12 may be configured to have (1) the source region 20 of the memory transistor 14 coupled to the source line 30 (SL), (2) the gate 16 of the memory transistor 14 coupled to the word line 28 (WL), (3) the intermediate node 50 coupling the drain region 22 of the memory transistor 14 and the source region 60 of the select transistor 54, (4) the gate 56 of the select transistor 54 coupled to the control line 48 (CL), and (5) the drain region 62 of the select transistor 54 coupled to the bit line 32 (BL).

For example, the source line 30 (SL) may be coupled to a constant voltage source (e.g., a DC voltage source) and the bit line 32 (BL) may be coupled to a variable voltage source (e.g., an AC voltage source). The word line 28 (WL) and/or the control line 48 (CL) may be coupled to a variable voltage source (e.g., an AC voltage source). As described above, the select transistor 54 may be configured to couple the memory transistor 14 to the bit line 32 (BL) and therefore controls an operation (e.g., read, write, and/or refresh) of the memory transistor 14. The select transistor 54 may couple the memory transistor 14 to the bit line 32 (BL) by applying appropriate control signals to the select transistor 54 via the control line 48 (CL). The control signals applied to the control line 48 (CL) may turn "ON" or "OFF" (e.g., forward bias or reverse bias the select transistor 54 in order to achieve or prevent avalanche impact ionization) the select transistor 54. For example, the memory transistor 14 may be coupled to the bit line 32 (BL) when the select transistor 54 is turned "ON." The memory transistor 14 may be shielded from the bit line 32 (BL) when the select transistor 54 is turned "OFF."

Figure 11:
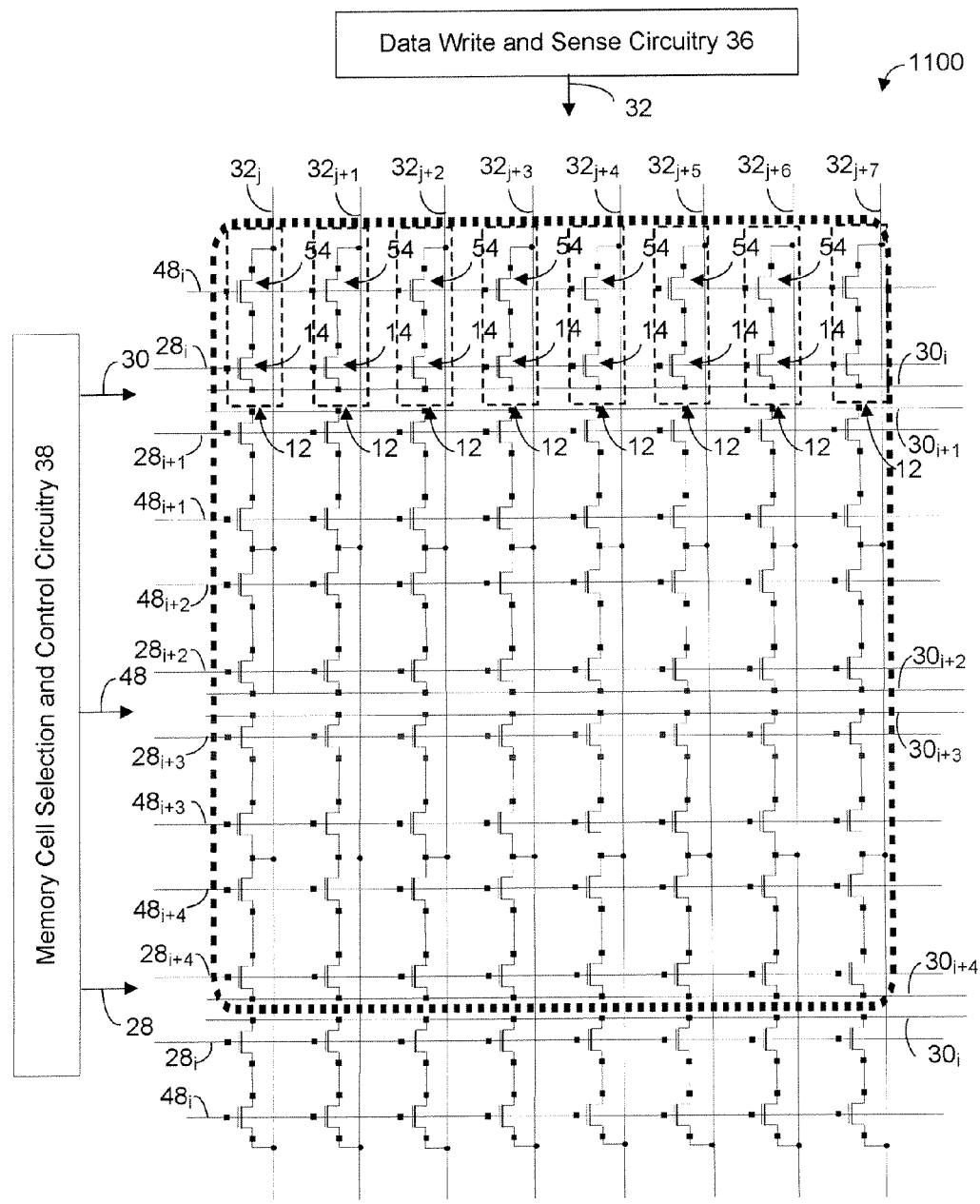
FIG. 11 shows an exemplary embodiment of a semiconductor memory device having a plurality of multiple transistor memory cells and a separate source line configuration in accordance with an embodiment of the present disclosure.

Referring to FIG. 11, there is shown an exemplary embodiment of a semiconductor memory device 1100 having a plurality of multiple transistor memory cells 12 and a separate source line configuration in accordance with an embodiment of the present disclosure. The semiconductor memory device 1100 may include a plurality of sub-arrays of memory cells 12 (for example, an 5×8 sub-array of memory cells 12 enclosed by the dotted line) arranged in rows and columns. Each memory cell 12 may include a memory transistor 14 and a select transistor 54, as described in FIG. 10. The semiconductor memory device 1100 may include data write and sense circuitry 36 coupled to a plurality of bit lines 32 (BL) of the plurality of memory cells 12 (for example, $32_j$, $32_{j+1}$, $32_{j+2}$, $32_{j+3}$, $32_{j+4}$, $32_{j+5}$, $32_{j+6}$, and $32_{j+7}$). Also, the semiconductor memory device 1100 may include memory cell selection and control circuitry 38 coupled to a plurality of word lines 28 (WL) (for example, $28_i$, $28_{i+1}$, $28_{i+2}$, $28_{i+3}$, and $28_{i+4}$), a plurality of source lines 30 (SL) (for example, $30_i$, $30_{i+1}$, $30_{i+2}$, $30_{i+3}$, and $30_{i+4}$), and/or a plurality of control lines 48 (CL) (for example, $48_i$, $48_{i+1}$, $48_{i+2}$, $48_{i+3}$, and $48_{i+4}$).

As illustrated in FIG. 11, the sub-array of memory cells 12 may include five rows by eight columns of memory cells 12. It may be appreciated by one skilled in the art that the size of the sub-array of memory cells 12 may vary. For example, the sub-array of memory cells 12 may be a symmetrical sub-array including, but not limited to, four rows by four columns, sixteen rows by sixteen columns, thirty-two rows by thirty-two columns, sixty-four rows by sixty-four columns, etc. Also, the sub-array of memory cells 12 may be an asymmetrical sub-array including, for example, but not limited to, four rows by third-two columns, eight rows by four columns, sixteen rows by thirty-two columns, etc.

In an exemplary embodiment, memory cells 12 may be written to using a two step operation wherein a given row of memory cells 12 may be written to a first predetermined data state by first executing a "clear" operation (for example, a selected row and/or all of the memory cells 12 of the selected row are written or programmed to a logic low (i.e., a binary "0" date state)) and thereafter one or more selected memory cells 12 may be written to a second predetermined data state (i.e., a selective write operation to the second predetermined data state, such as a logic high (i.e., a binary "1" data state)). The "clear" operation may be performed by writing each memory cell 12 of the given row to a first predetermined data state (in this exemplary embodiment the first predetermined data state is a logic low (i.e., a binary "0" data state)) using the inventive technique described above.

In particular, a memory transistor 14 of each memory cell 12 of a selected row (for example, memory cells associated with word line $28_i$ (WL)) is controlled to store a majority charge carrier 34 concentration in the electrically floating body region 18 of the memory transistor 14 which corresponds to a logic low (i.e., a binary "0" data state). For example, control signals to implement a "clear" operation may be applied to the gate 16, the source region 20, and the drain region 22 of the memory transistor 14 of memory cells 12. In an exemplary embodiment, a "clear operation" includes applying (i) −1.1V to the gate 16 of the memory transistor 14, (ii) 2.3V to the source region 20 of the memory transistor 14, (iii) 1.1V to the gate 56 of the select transistor 54, and (iv) 0.5V to the drain region 62 of the select transistor 54. In response, the same logic state (for example, a logic low (i.e., a binary "0" data state)) may be stored in memory cells 12 and the state of memory cells 12 may be "cleared." For example, it may be preferable to maintain the gate-to-source voltage below the threshold voltage of the transistor of memory cell 12 to further minimize or reduce power consumption.

Thereafter, one or more selected memory cells 12 of a selected row may be written to the second predetermined logic state. For example, the memory transistors 14 of memory cells 12 of a selected row may be written to the second predetermined logic state in order to store the second predetermined logic state in the memory cells 12. For example, one or more selected memory cells 12 may be written to a logic high (i.e., a binary "1" data state) (i.e., in selected row $28_i$ in FIG. 11), via an impact ionization effect and/or avalanche multiplication, by applying (i) −1.1V to the gate 16 of the memory transistor 14 (via word lines 28 (WL)), (ii) 2.3V to the source region 20 of the memory transistor 14 (via source lines 30 (SL)), (iii) 1.1V to the gate 56 of the select transistor 54 (via control lines 48 (CL)), and (iv) 0.0V to the drain region 62 of the select transistor 54 (via bit lines 32(BL)). Particularly, such control signals may generate or provide a bipolar current in the electrically floating body region 18 of the memory transistor 14 of the one or more memory cells 12. The bipolar current may cause or produce an impact ionization and/or avalanche multiplication phenomenon in the electrically floating body region 18 of the memory transistors 14 of the one or more memory cells 12. In this way, an excess of majority charge carriers 34 may be provided and stored in the electrically floating body region 18 of the memory transistor 14 of one or more memory cells 12 which corresponds to a logic high (i.e., a binary "1" data state).

In an exemplary embodiment, unselected memory cells 12 may be maintained at a logic low (i.e., a binary "0" data state) by applying a voltage to inhibit impact ionization to the drain region 62 of select transistor 54 of the memory cells 12. For example, applying 1.1V to the drain regions 62 of select transistors 54 of memory cells 12 (via bit lines $32_j$, $32_{j+1}$, $32_{j+2}$, $32_{j+3}$, $32_{j+4}$, $32_{j+5}$, $32_{j+6}$, and $32_{j+7}$) may inhibit impact ionization in unselected memory cells 12 during the selective write operation for the memory cells 12.

A selected row of memory cells 12 may be read by applying read control signals to the associated word line (WL) 28, associated source lines (SL) 30, and associated control lines (CL) 48, and sensing a signal (voltage and/or current) on associated bit lines (BL) 32 and associated control lines (CL) 48. In an exemplary embodiment, memory cells 12 may be read by applying (i) −1.1V to the gate 16 of the memory transistor 14 (via word lines 28 (WL)), (ii) 2.3V to the source region 20 of the memory transistor 14 (via source lines 30 (SL)), (iii) 1.5V to the gate 56 of the select transistor 54 (via control lines 48 (CL)) and (iv) 0V to the drain region 62 of the select transistor (via bit lines 32 (BL)). The data write and sense circuitry 36 may read the data state of the memory cells 12 by sensing the response to the read control signals applied to word line 28 (WL), source line 30 (SL), control line 48 (CL), and bit line 32 (BL). In response to the read control signals, memory cells 12 may generate a bipolar transistor current which may be representative of the data state of memory cells 12. For example, memory cells 12 (which were earlier written to a logic high (i.e., a binary "1" data state)), in response to the read control signals, may generate a bipolar transistor current which is considerably larger than any channel current. In contrast, in memory cells 12 (which were earlier programmed to a logic low (i.e., a binary "0" data state)), such control signals induce, cause and/or produce little to no bipolar transistor current (for example, a considerable, substantial or sufficiently measurable bipolar transistor current). The circuitry in data write and sense circuitry 36 to sense the data state (for example, a cross-coupled sense amplifier) senses the data state using primarily and/or based substantially on the bipolar transistor current.

Thus, in response to read control signals, the memory transistor 14 of each memory cell 12 may generate a bipolar transistor current which is representative of the data state stored therein. The circuitry in data write and sense circuitry 36 may determine the data state of memory cells 12 based substantially on the bipolar transistor current induced, caused, and/or produced in response to the read control signals.

Figure 12:
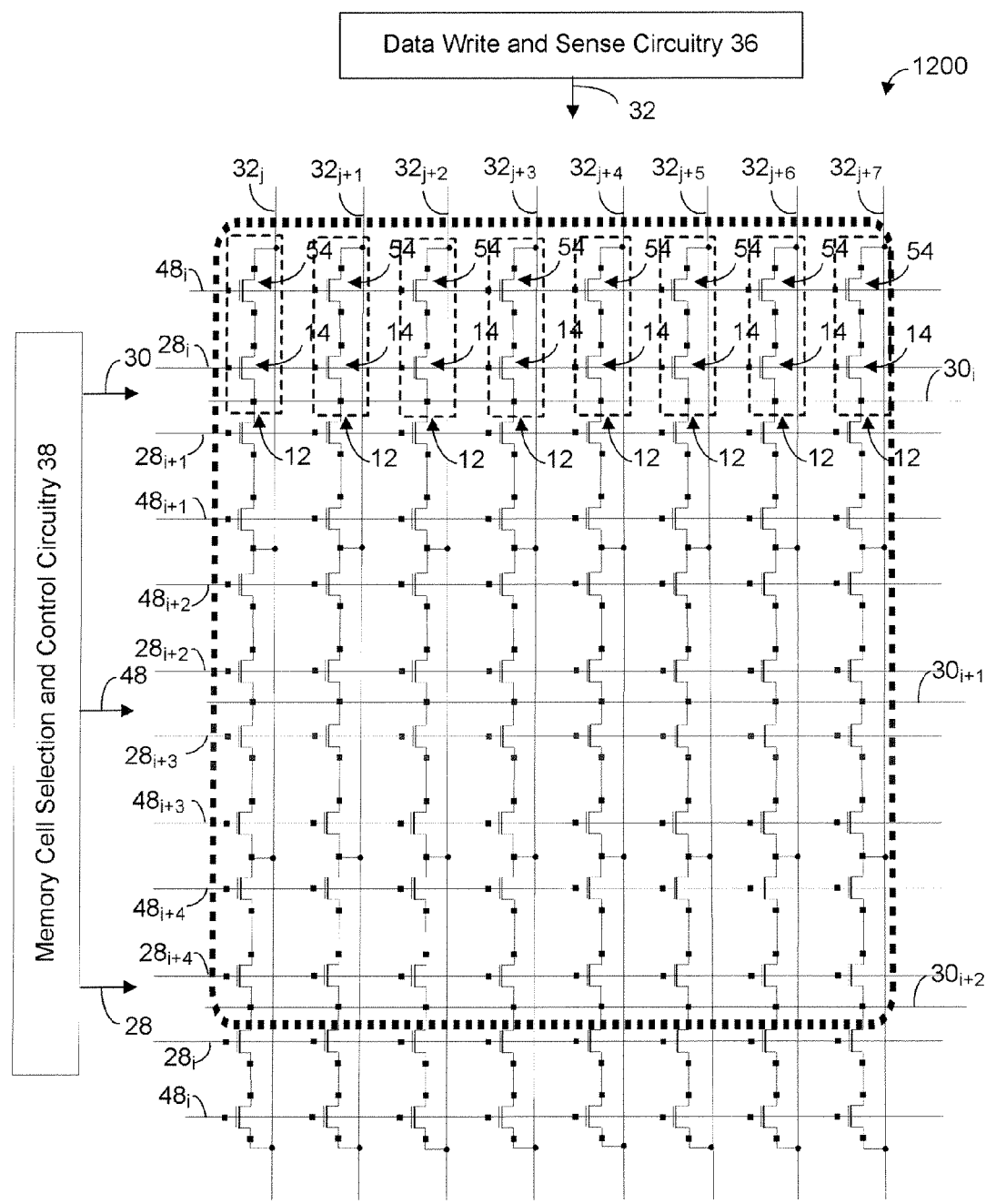
FIG. 12 shows an exemplary embodiment of a semiconductor memory device having a plurality of multiple transistor memory cells and a common source line configuration in accordance with an embodiment of the present disclosure.

Referring to FIG. 12, there is shown an exemplary embodiment of a semiconductor memory device 1200 having a plurality of multiple transistor memory cells 12 and a common source line 30 (SL) configuration in accordance with an exemplary embodiment of the present disclosure. As mentioned above, the present disclosure may be implemented in any memory array architecture having a plurality of memory cells 12 that may employ memory transistors 14 and select transistors 54. Thus, as illustrated in FIG. 12, the semiconductor memory device 1200 is configured having a common source line 30 (SL) for every two rows of memory cells 12 (e.g., a row of memory cells 12 may include a common word line 28 (WL)). The semiconductor memory device 1200 may include one or more sub-arrays of memory cells 12 (for example, an 5×8 sub-array of memory cells 12 enclosed by the dotted line). The semiconductor memory device 1200 may include data write and sense circuitry 36 coupled to a plurality of bit lines (BL) 32 of the plurality of memory cells 12 (for example, $32_j$, $32_{j+1}$, $32_{j+2}$, $32_{j+3}$, $32_{j+4}$, $32_{j+5}$, $32_{j+6}$, and $32_{j+7}$). Also, the memory array 1200 may include memory cell selection and control circuitry 38 coupled to one or more word lines (WL) 28 (for example, $28_i$, $28_{i+1}$, $28_{i+2}$, $28_{i+3}$, and $28_{i+4}$), one or more control lines (CL) 48 (for example, $48_i$, $48_{i+1}$, $48_{i+2}$, $48_{i+3}$, and $48_{i+4}$), and/or one or more source lines (SL) 30 (for example, $30_i$, $30_{i+1}$, and $30_{i+2}$).

Figure 13:
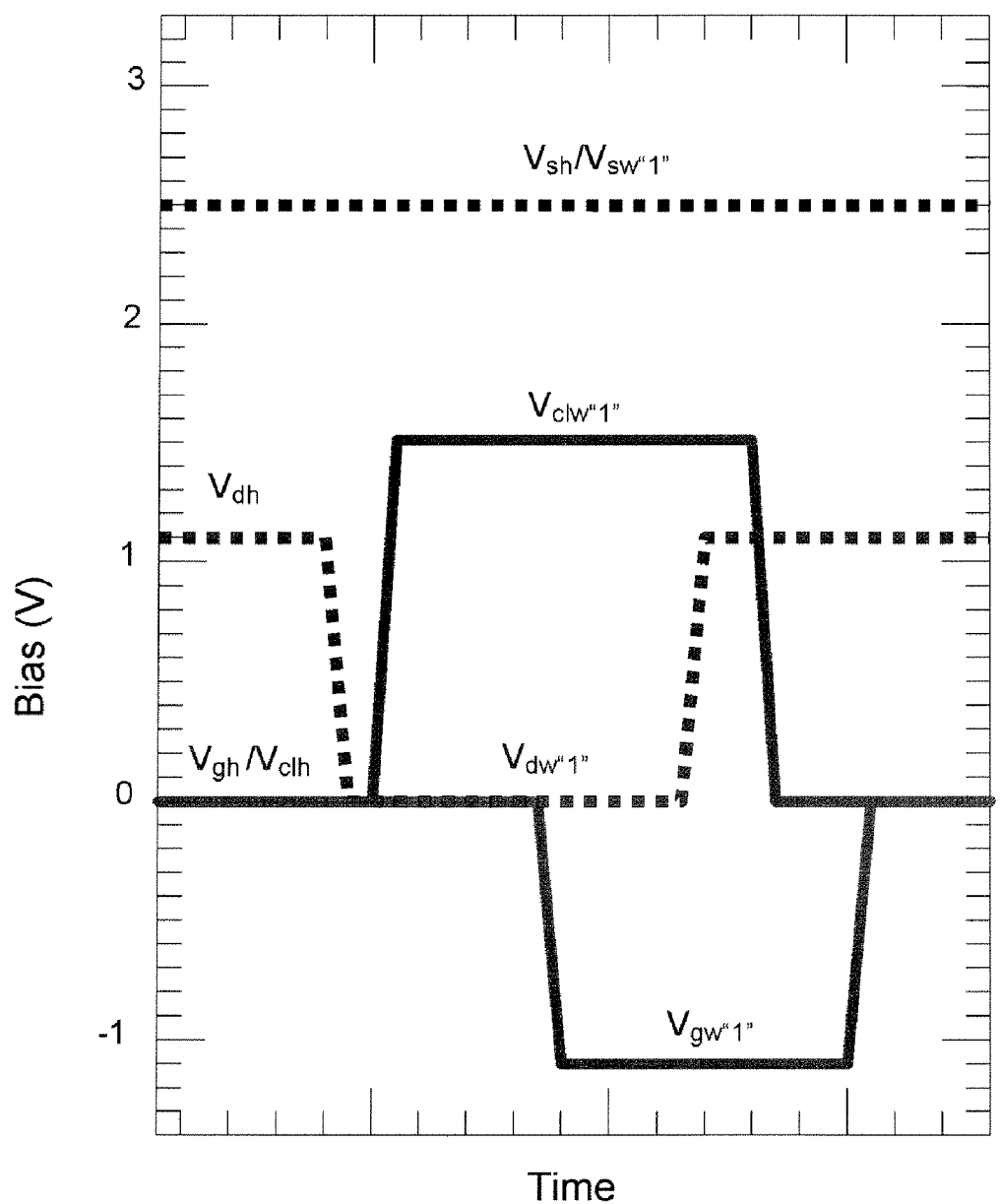
FIG. 13 shows a diagram of voltage control signals to implement a write operation for logic high (i.e., a binary "1" data state) into a memory cell with a plurality of transistors in accordance with an embodiment of the present disclosure.

FIG. 13 shows a diagram of voltage control signals to implement a write operation for logic high (i.e., a binary "1" data state) into a memory cell 12 with a plurality of transistors in accordance with an embodiment of the present disclosure. The control signals may be configured to perform a one step write whereby one or more selected memory cells 12 of one or more selected rows of memory cells 12 may be selectively written or programmed to either a logic high (i.e., a binary "1" data state) or a logic low (i.e., a binary "0" date state) without first implementing a "clear" operation. Initially, the temporally varying control signals may implement a hold operation including a voltage potential applied to the source region 20 ($V_{sh}$) of the memory transistor 14, a voltage potential applied to the gate 16 ($V_{gh}$) of the memory transistor 14, a voltage potential applied to the gate 56 ($V_{clh}$) of the select transistor 54, and a voltage potential applied to the drain region 62 ($V_{dh}$) of the select transistor 54. In an exemplary embodiment, a constant source voltage ($V_{sh}$) of approximately 2.3V may be applied to the source region 20 (via, for example, the associated source lines $30_i$, $30_{i+1}$, $30_{i+2}$, $30_{i+3}$, and $30_{i+4}$) of the memory transistor 14, a gate voltage ($V_{gh}$) of approximately 0.0V may be applied to the gate 16 of the memory transistor 14 (via, for example, the associated word line $28_i$, $28_{i+1}$, $28_{i+2}$, $28_{i+3}$, $28_{i+4}$), and a control line voltage ($V_{clh}$) of approximately 0.0V may be applied to the gate 56 (via, for example, the associated control lines $48_i$, $48_{i+1}$, $48_{i+2}$, $48_{i+3}$, and $48_{i+4}$) of the select transistor 54, and a drain voltage ($V_{dh}$) of approximately 1.1V may be applied to the drain region 62 (via, for example, the associated bit line $32_j$, $32_{j+1}$, $32_{j+2}$, $32_{j+3}$, $32_{j+4}$, $32_{j+5}$, $32_{j+6}$, and $32_{j+7}$) of the select transistor 54 of the memory cell 12.

Also, the temporally varying control signals to implement the write a logic high (i.e., a binary "1" data state) operation include a voltage potential applied to the source region 20 ($V_{sw"1"}$) of the memory transistor 14, a voltage potential applied to the gate 16 ($V_{gw"1"}$) of the memory transistor 14, a voltage potential applied to the gate 56 ($V_{clw"1"}$) of the select transistor 54, and a voltage potential applied to the drain region 62 ($V_{dw"1"}$) of the select transistor 54. The binary "1" data state may be written to one or more selected memory cells 12 by applying appropriate source line (SL) voltages, word line (WL) voltages, control line (CL) voltages, and/or bit line (BL) voltages. For example, a constant source voltage of approximately 2.3V may be applied to the source region 20 (via, for example, the associated source lines $30_i$, $30_{i+1}$, $30_{i+2}$, $30_{i+3}$, and $30_{i+4}$) of the memory transistor 14, a control line voltage ($V_{clw"1"}$) of approximately 1.5V may be applied to the gate 56 (via, for example, the associated control lines $48_i$, $48_{i+1}$, $48_{i+2}$, $48_{i+3}$, and $48_{i+4}$) of the select transistor 54, and a drain voltage ($V_{dw"1"}$) of approximately 0V may be applied to the drain region 62 (via, for example, the associated selected bit line $32_j$, $32_{j+1}$, $32_{j+2}$, $32_{j+3}$, $32_{j+4}$, $32_{j+5}$, $32_{j+6}$, and $32_{j+7}$) of the select transistor 54 before a gate voltage ($V_{gw"1"}$) of approximately −1.1V may be applied to the gate 16 of the memory transistor 14 (via, for example, the associated word line $28_i$, $28_{i+1}$, $28_{i+2}$, $28_{i+3}$, $28_{i+4}$), simultaneously thereto, or after the gate voltage ($V_{gw"1"}$) is applied to gate 16 of the memory transistor 14. It is preferred that the drain voltage ($V_{dw"1"}$) include an amplitude which may be sufficient to maintain a bipolar current that is suitable for programming the memory cell 12 to a logic high (i.e., a binary "1" data state). Therefore, majority charge carriers 34 may be generated in the electrically floating body region 18 of the memory transistor 14 via a bipolar current and majority charge carriers 34 may accumulate (and be stored) in a portion of the electrically floating body region 18 of the memory transistor 14 of the memory cell 12 that may be juxtaposed or near the gate dielectric (which is disposed between the gate 16 and the electrically floating body region 18). An unselected hold drain voltage ($V_{dh}$) of approximately 1.1V may be applied to the drain region 62 (via, for example, the associated unselected bit line $32_j$, $32_{j+1}$, $32_{j+2}$, $32_{j+3}$, $32_{j+5}$, $32_{j+6}$, and $32_{j+7}$) of the select transistor 54 of the memory cell 12.

Figure 14:
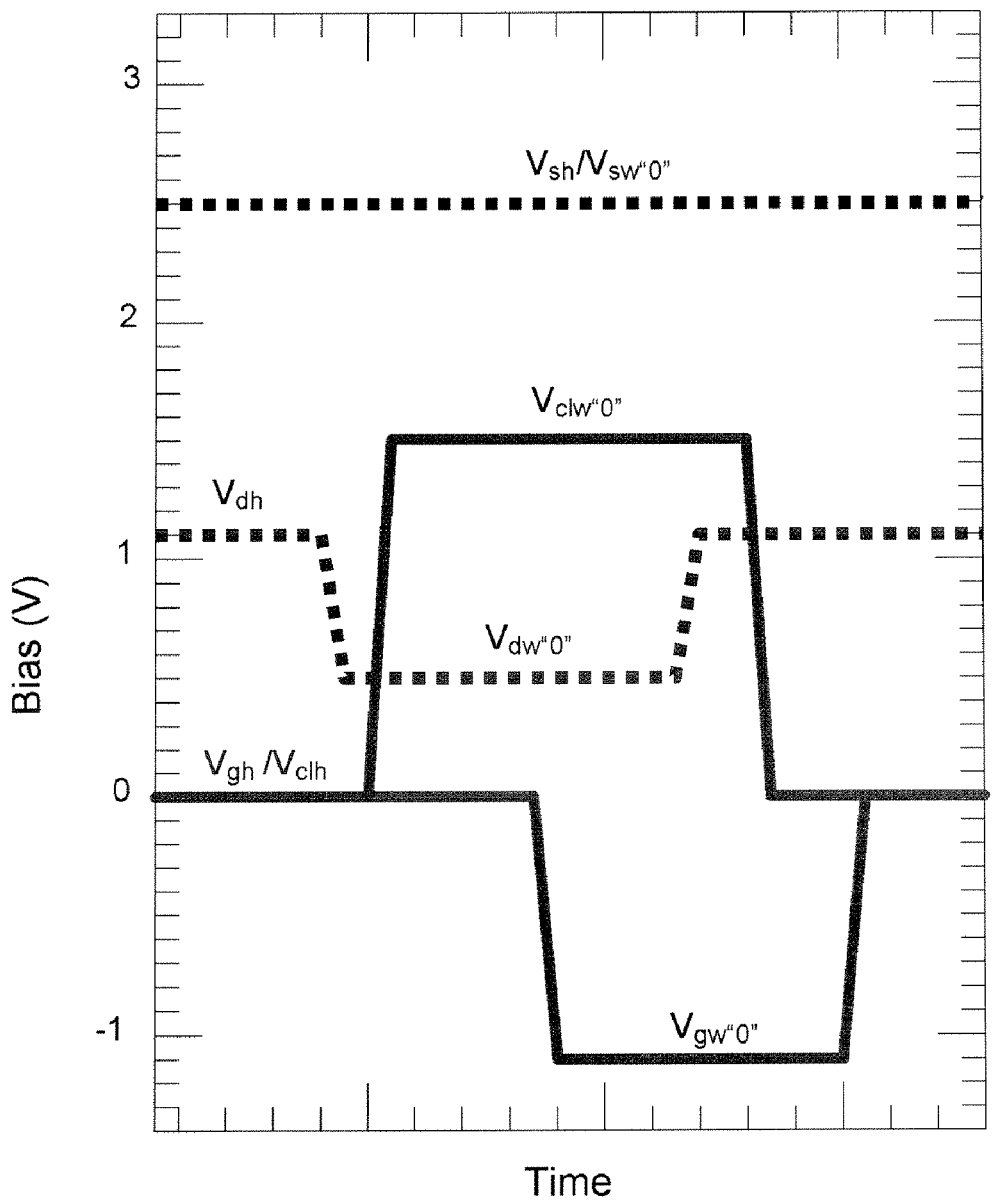
FIG. 14 shows a diagram of voltage control signals to implement a write operation for logic low (i.e., a binary "0" data state) into a memory cell with a plurality of transistors in accordance with an embodiment of the present disclosure.

FIG. 14 shows a diagram of voltage control signals to implement a write operation for a logic low (i.e., a binary "0" data state) into a memory cell 12 with a plurality of transistors in accordance with an embodiment of the present disclosure. As described above, the temporally varying control signals may implement a hold operation by including a voltage potential applied to the source region 20 ($V_{sh}$) of the memory transistor 14, a voltage potential applied to the gate 16 ($V_{gh}$) of the memory transistor 14, a voltage potential applied to the gate 56 ($V_{clh}$) of the select transistor 54, and a voltage potential applied to the drain region 62 ($V_{dh}$) of the select transistor 54. Also, the temporally varying control signals that may be implemented to write logic low (i.e., a binary "0" data state) may include a constant voltage potential applied to the source region 20 ($V_{sw\text{"}0\text{"}}$) of the memory transistor 14, a voltage potential applied to the gate 16 ($V_{gw\text{"}0\text{"}}$) of the memory transistor 14, a control line voltage potential applied to the gate 56 ($V_{clw\text{"}0\text{"}}$) (via, for example, the associated selected control lines $48_i$, $48_{i+1}$, $48_{i+2}$, $48_{i+3}$, and $48_{i+4}$) of the select transistor 54, and a voltage potential applied to the drain region 22 ($V_{dw\text{"}0\text{"}}$) of the select transistor 54. For example, a constant source voltage ($V_{sw\text{"}0\text{"}}$) of approximately 2.3V may be applied to the source region 20 (via, for example, the associated source lines $30_i$, $30_{i+1}$, $30_{i+2}$, $30_{i+3}$, and $30_{i+4}$) of the memory transistor 14, a control line voltage ($V_{clw\text{"}0\text{"}}$) of approximately 1.5V may be applied to the gate 56 (via, for example, the associated control lines $48_i$, $48_{i+1}$, $48_{i+2}$, $48_{i+3}$, and $48_{i+4}$) of the select transistor 54, and a drain voltage ($V_{dw\text{"}0\text{"}}$) of approximately 0.5V may be applied to the drain region 62 (via, for example, the associated bit lines $32_i$, $32_{i+1}$, $32_{i+2}$, $32_{i+3}$, $32_{i+4}$, $32_{i+5}$, $32_{i+6}$, and $32_{i+7}$) of the select transistor 54, before a gate voltage ($V_{gw\text{"}0\text{"}}$) of approximately −1.1V may be applied to the gate 16 (via, for example, the associated word lines $28_i$, $28_{i+}$, $28_{i+2}$, $28_{i+3}$, and $28_{i+4}$) of the memory transistor 14, or simultaneously thereto, or after the gate voltage ($V_{gw\text{"}0\text{"}}$) is applied to the gate 16 of the memory transistor 14. Particularly, the source to drain voltage ($V_{Sw\text{"}0\text{"}} - V_{dw\text{"}0\text{"}}$) of the memory transistor 14 may include an amplitude which may be insufficient to maintain a bipolar current that is suitable for writing the memory cell 12 to a logic high (i.e., a binary "1" data state). An unselected hold drain voltage ($V_{dh}$) of approximately 1.1V may be applied to the drain region 62 (via, for example, the associated unselected bit line $32_j$, $32_{j+1}$, $32_{j+2}$, $32_{j+3}$, $32_{j+4}$, $32_{j+5}$, $32_{j+6}$, and $32_{j+7}$) of the select transistor 54 of the memory cell 12.

Figure 15:
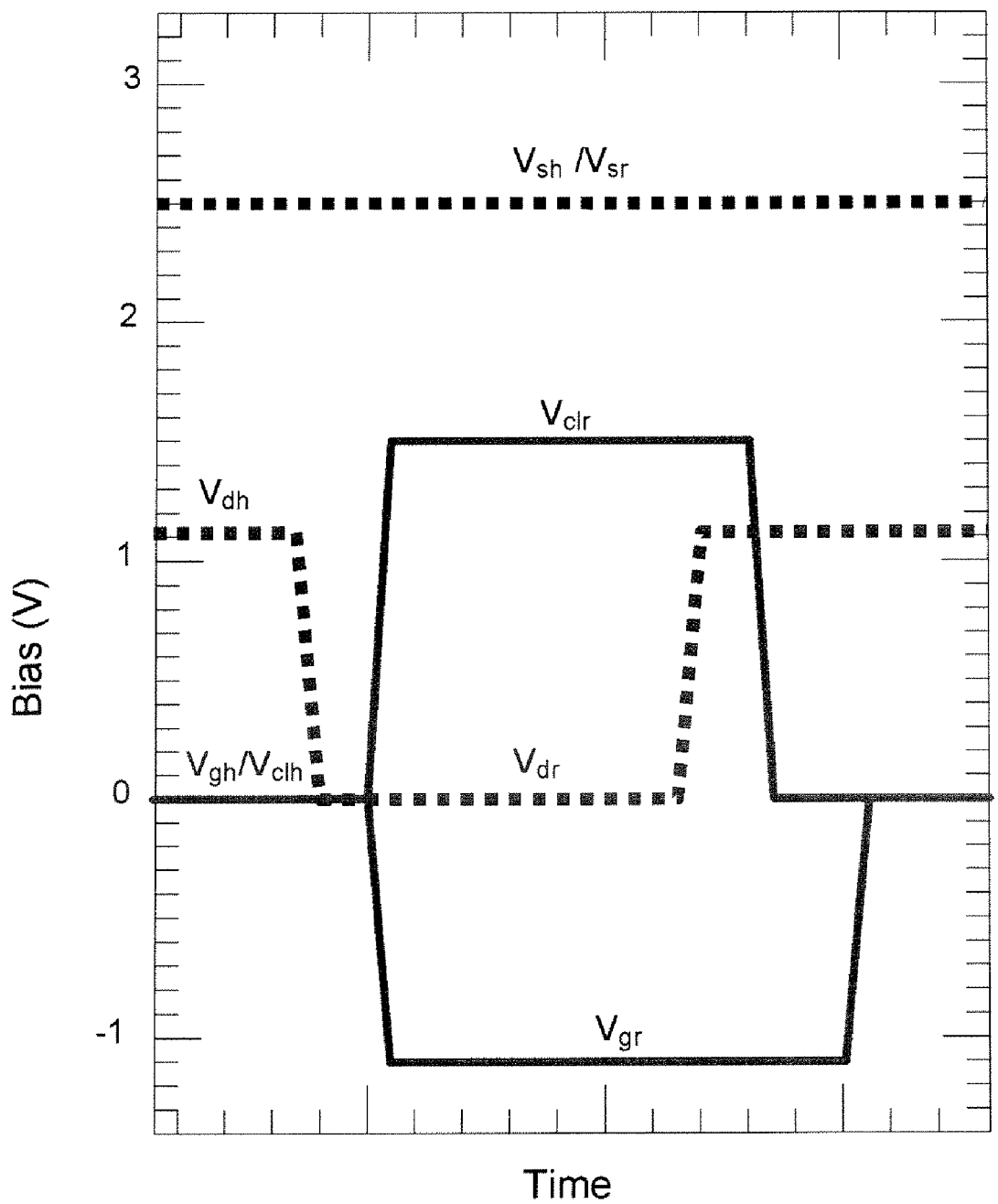
FIG. 15 shows a diagram of voltage control signals to implement a read operation of a memory cell with a plurality of transistors in accordance with an embodiment of the present disclosure.

FIG. 15 shows a diagram of voltage control signals to implement a read operation of a memory cell 12 with a plurality of transistors in accordance with an embodiment of the present disclosure. As described above, the temporally varying control signals may implement a hold operation by including a voltage potential applied to the source region 20 ($V_{sh}$) of the memory transistor 14, a voltage potential applied to the gate 16 ($V_{gh}$) of the memory transistor 14, a voltage potential applied to the gate 56 ($V_{clh}$) of the select transistor 54, and a voltage potential applied to the drain region 62 ($V_{dh}$) of the select transistor 54. Also, the temporarily varying control signals may implement a reading operation. For example, read control signals may be applied to the source region 20 of the memory transistor 14, the gate 16 of the memory transistor 14, the gate 56 of the select transistor 54, the drain region 62 of the select transistor 54. A source voltage ($V_{sr}$) of approximately 2.3V may be applied to the source region 20 of the memory transistor 14, a control line voltage ($V_{clr}$) of approximately 1.5V may be applied to the gate 56 of the select transistor 54, and a drain voltage ($V_{dr}$) of approximately 0V may be applied to the drain region 62 of the select transistor 54, before application of a gate voltage ($V_{gr}$) of approximately −0.5V applied to the gate 16 of the memory transistor 14, simultaneously thereto, or after the gate voltage ($V_{gr}$) is applied to the gate 16 of the memory transistor 14. Also, an unselected hold drain voltage ($V_{dh}$) of approximately 1.1V may be applied to the drain region 62 (via, for example, the associated unselected bit line $32_j$, $32_{j+1}$, $32_{j+2}$, $32_{j+3}$, $32_{j+4}$, $32_{j+5}$, $32_{j+6}$, and $32_{j+7}$) of the select transistor 54 of the memory cell 12.

In an exemplary embodiment, during the read operation, a bipolar current is generated in the memory transistors 14 of the memory cells 12 storing a logic high (i.e., a binary "1" data state) and little to no bipolar current is generated in the memory transistors 14 of the memory cells 12 storing a logic low (i.e., a binary "0" data state). The data state may be determined primarily by, sensed substantially using and/or based substantially on the bipolar transistor current that is responsive to the read control signals and significantly less by the interface channel current component, which is less significant and/or negligible relatively to the bipolar component.

The writing and reading techniques described herein may be employed in conjunction with a plurality of memory cells 12 arranged in an array of memory cells 12. A memory array implementing the structure and techniques of the present disclosures may be controlled and configured including a plurality of memory cells 12 having memory transistor 14 and select transistor 54. The exemplary layouts or configurations (including exemplary control signal voltage values), in accordance to one or more exemplary embodiments of the present disclosure are shown, each consisting of the control signal waveforms and exemplary array voltages during one-step writing and/or reading.

Accordingly, the illustrated/exemplary voltage levels to implement the write and/or read operations are merely exemplary. The indicated voltage levels may be relative or absolute. Alternatively, the voltages indicated may be relative in that each voltage level, for example, may be increased or decreased by a given voltage amount (e.g., each voltage may be increased or decreased by 0.5V, 1.0V and 2.0V) whether one or more of the voltages (e.g., the source region voltage, the drain region voltage or the gate voltage) become or are positive and negative.

Figure 16:
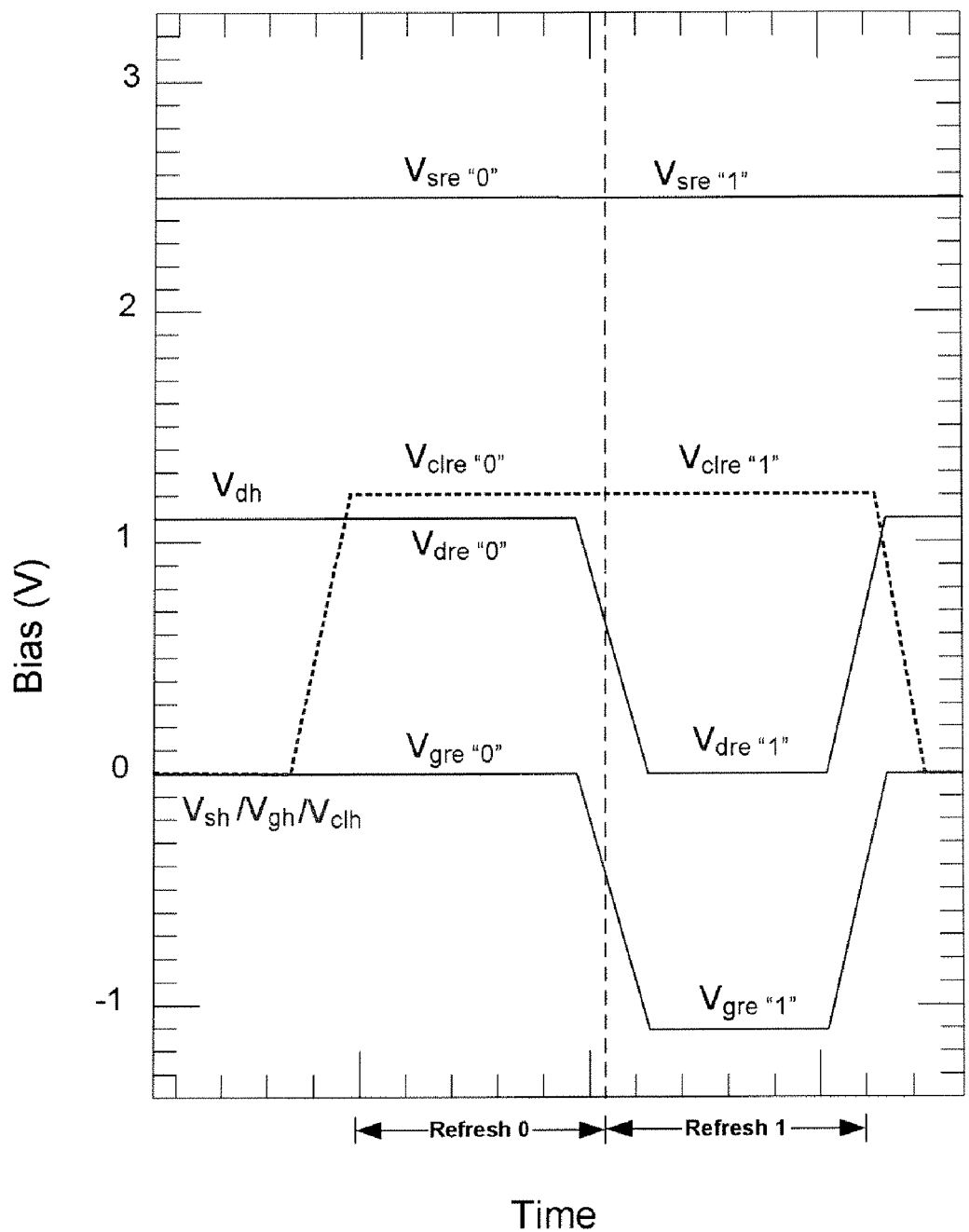
FIG. 16 shows a diagram of voltage control signals to implement a refresh operation of a memory cell with a plurality of transistors in accordance with an embodiment of the present disclosure.

FIG. 16 shows a diagram of voltage control signals to implement a refresh operation of a memory cell 12 with a plurality of transistors in accordance with an embodiment of the present disclosure. The temporally varying control signals may implement a hold operation by including a voltage potential applied to the source region 20 ($V_{sh}$) of the memory transistor 14, a voltage potential applied to the gate 16 ($V_{gh}$) of the memory transistor 14, a voltage potential applied to the gate 56 ($V_{clh}$) of the select transistor 54, and a voltage potential applied to the drain region 62 ($V_{dh}$) of the select transistor 54. For example, a constant source voltage ($V_{sh}$) of approximately 2.3V may be applied to the source region 20 (via, for example, the associated source lines 30 (SL)) of the memory transistor 14, a gate voltage ($V_{gh}$) of approximately 0.0V may be applied to the gate 16 of the memory transistor 14 (via, for example, the associated word line $28_i$ (SL)), and a control line voltage ($V_{clh}$) of approximately 0.0V may be applied to the gate 56 (via, for example, the associated control lines 48 (CL)) of the select transistor 54, and a drain voltage ($V_{dh}$) of approximately 1.1V may be applied to the drain region 62 (via, for example, the associated bit line 32 (BL)) of the select transistor 54 of the memory cell 12.

The application of the temporally varying control signals may implement a block refresh operation of a logic high (i.e., a binary "1" data state) and a logic low (i.e., a binary "0" data state) in a single block refresh cycle. For example, the block refresh cycle may include a logic high (i.e., a binary "1" data state) block refresh phase and a logic low (i.e., a binary "0" data state) block refresh phase. In an exemplary embodiment, block refresh control signals may be applied to the source region 20 of the memory transistor 14, the gate 16 of the memory transistor 14, the gate 56 of the select transistor 54, and the drain region 62 of the select transistor 54 to block refresh a logic high (i.e., a binary "1" data state) and/or a logic low (i.e., a binary "0" data state). During the logic low (i.e., a binary "0" data state) block refresh phase, a constant source voltage ($V_{sre\,"0"}$) of approximately 2.3V may be applied to the source region 20 of the memory transistor 14 and a gate voltage ($V_{gre\,"0"}$) of approximately 0.0V may be applied to the gate 16 of the memory transistor 14. Also, a control line voltage ($V_{clre\,"0"}$) of approximately 1.2V may be applied to the gate 56 of the select transistor 54, and a drain voltage ($V_{dre\,"0"}$) of approximately 1.1V may be applied to the drain region 62 of the select transistor 54. By applying a control line voltage ($V_{clre\,"0"}$) of approximately 1.2V to the gate 56 of the select transistor 54, the select transistor 54 may become forward biased or turned "ON." The forward biased select transistor 54 may couple the memory transistor 14 to the bit line 32 (BL), as described above. The select transistor 54 may couple the voltage potential applied to the bit line 32 (BL) (e.g., the drain voltage ($V_{dre\,"0"}$) applied to the drain region 62 of the select transistor 54) to drain region 22 of the memory transistor 14. Therefore, the intermediate node 50 between the source region 60 of the select transistor 54 and the drain region 22 of the memory transistor may have a voltage potential of approximately 1.1V, similar to the voltage potential applied to the bit line 32 (BL) (e.g., the drain voltage ($V_{dre\,"0"}$) applied to the drain region 62 of the select transistor 54). By applying the bit line 32 (BL) voltage potential to the drain region 22 of the memory transistor 14, the junction between the electrically floating body region 18 of the memory transistor 14 and the drain region 22 of the memory transistor 14 may become forward biased and may remove an amount of majority charge carriers 34 (e.g., electrons or holes) from the electrically floating body region 18 of the memory transistor 14. The removal of the majority charge carriers 34 from the electrically floating body region 18 of the memory transistor 14 may refresh one or more memory cells 12 that may store a logic low (i.e., a binary "0" data state). In the event that the memory cells 12 may store a logic high (i.e., a binary "1" data state), the majority charge carriers 34 may also be removed from the electrically floating body region 18 of the memory transistor 14. Thereafter, logic high (i.e., a binary "1" data state) block refresh, as will be described below in detail, may be performed to restore a logic high (i.e., a binary "1" data state) in the memory cells 12.

During the logic high (binary "1" date state) block refresh phase, a constant source voltage ($V_{sre\,"1"}$) of approximately 2.3V may be applied to the source region 20 of the memory transistor 14 and a gate voltage ($V_{gre\,"1"}$) of approximately −1.1V may be applied to the gate 16 of the memory transistor 14. Also, a control line voltage ($V_{clre\,"1"}$) of approximately 1.2V may be applied to the gate 56 of the select transistor 54, and a drain voltage ($V_{dre\,"1"}$) of approximately 0.0V may be applied to the drain region 62 of the select transistor 54. By applying a control line voltage ($V_{clre\,"1"}$) of approximately 1.2V to the gate 56 of the select transistor 54, the select transistor 54 may become forward biased or turned "ON." The forward biased select transistor 54 may couple the memory transistor 14 to the bit line 32 (BL), as described above. The select transistor 54 may couple the voltage potential applied to the bit line 32 (BL) (e.g., the drain voltage ($V_{dre\,"1"}$) applied to the drain region 62 of the select transistor 54) to drain region 22 of the memory transistor 14. Therefore, the intermediate node 50 between the source region 60 of the select transistor 54 and the drain region 22 of the memory transistor may have a voltage potential of approximately 0.0V, similar to the voltage potential applied to the bit line 32 (BL) (e.g., the drain voltage ($V_{dre\,"1"}$) applied to the drain region 62 of the select transistor 54). The drain voltage ($V_{dre\,"1"}$) applied to the drain region 22 of the memory transistor 14 and/or an amount of majority charge carriers 34 accumulated in the electrically floating body region 18 of the memory transistor 14 (e.g., remained after removal of majority charge carriers 34 performed by logic low (i.e., a binary "0" data state) block refresh) may trigger an impact ionization effect and/or avalanche multiplication in the memory transistor 14. The impact ionization effect and/or avalanche multiplication within the memory transistor 14 may cause majority charge carriers 34 to replenish in the electrically floating body region 18 of the memory transistor 14. In another exemplary embodiment, the memory transistor 14 may store a logic low (i.e., a binary "0" data state), the memory transistor 14 may not trigger into an impact ionization effect and/or avalanche multiplication because of an insufficient amount of majority charge carriers 34 stored in the electrically floating body region 18 of the memory transistor 14.

As described in FIGS. 11 and 12, a plurality of select transistors 54 may be coupled to the control line 48 (CL). For example, by applying an appropriate voltage potential to the gate 56 of the plurality of select transistors 54 via the control line 48 (CL), the plurality of select transistors 54 may become forward biased and thus coupling a plurality of memory transistors 14 to the bit line 32 (BL). Therefore, the logic low (i.e., a binary "0" data state) refresh and/or the logic high (i.e., a binary "1" data state) refresh may be performed simultaneously to a plurality of memory cells 12.

At this point it should be noted that block refreshing a semiconductor memory device in accordance with the present disclosure as described above typically involves controlling the generation of control signals to block refresh a semiconductor memory device to some extent. This control signal generation may be implemented in hardware or software. For example, specific electronic components may be employed in a semiconductor memory device or similar or related circuitry for implementing the functions associated with controlling the generation of control signals to block refresh a semiconductor memory device in accordance with the present disclosure as described above. Alternatively, one or more processors operating in accordance with instructions may implement the functions associated with controlling the generation of control signals to block refresh a semiconductor memory device in accordance with the present disclosure as described above. If such is the case, it is within the scope of the present disclosure that such instructions may be stored on one or more processor readable media (e.g., a magnetic disk or other storage medium), or transmitted to one or more processors via one or more signals embodied in one or more carrier waves.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Further, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Accordingly, the claims set forth below should be construed in view of the full breadth and spirit of the present disclosure as described herein.

The invention claimed is:

1. A method for block refreshing a semiconductor memory device comprising the steps of:
arranging a plurality of memory cells in one or more arrays of rows and columns, each of the plurality of memory cells comprising:
a first region coupled to a source line;
a second region;
a first body region disposed between the first region and the second region, wherein the body region is electrically floating and charged to a first predetermined voltage potential;
a first gate coupled to a word line, wherein the first gate is spaced apart from, and capacitively coupled to, the first body region;
a third region coupled to the second region;
a fourth region coupled to a bit line;
a second body region disposed between the third region and the fourth region, wherein the second body region is charged to a second predetermined voltage potential; and
a second gate coupled to a control line spaced apart from, and capacitively coupled to, the second body region; and
applying voltage potentials to the plurality of memory cells to refresh a plurality of data states stored in the plurality of memory cells;
wherein the plurality of data states comprise a binary 0 data state and a binary 1 data state;
wherein applying voltage potentials to the plurality of memory cells further comprises a first voltage applied to the third region for the binary 0 data state and a second voltage applied to the first region for the binary 1 data state;
wherein the first voltage is same as the second voltage.

2. The method according to claim 1, wherein the plurality of data states stored in the plurality of memory cells are refreshed in a single refresh cycle.

3. The method according to claim 1, wherein applying voltage potentials to the plurality of memory cells further comprises a first voltage applied to the first region for the binary 0 data state and a second voltage applied to the first region for the binary 1 data state.

4. The method according to claim 3, wherein the first voltage is lower than the second voltage.

5. The method according to claim 1, wherein applying voltage potentials to the plurality of memory cells further comprises a third voltage applied to the first gate for the binary 0 data state and a fourth voltage applied to the first gate for the binary 1 data state.

6. The method according to claim 5, wherein the third voltage is higher than the fourth voltage.

7. The method according to claim 1, wherein applying voltage potentials to the plurality of memory cells further comprises a fifth voltage applied to the second region for the binary 0 data state and a sixth voltage applied to the second region for the binary 1 data state.

8. The method according to claim 7, wherein the fifth voltage and the sixth voltage are the same.

9. The method according to claim 1, wherein the plurality of data states stored in the plurality of memory cells are refreshed in a single refresh cycle.

10. The method according to claim 1, wherein applying voltage potentials to the plurality of memory cells further comprises a third voltage applied to the second gate for the binary 0 data state and a fourth voltage applied to the second gate for the binary 1 data state.

11. The method according to claim 10, wherein the third voltage is higher than the fourth voltage.

12. The method according to claim 1, wherein applying voltage potentials to the plurality of memory cells further comprises a fifth voltage applied to the second gate for the binary 0 data state and a sixth voltage applied to the second gate for the binary 1 data state.

13. The method according to claim 12, wherein the fifth voltage and the sixth voltage are the same.

14. The method according to claim 1, wherein applying voltage potentials to the plurality of memory cells further comprises a seventh voltage applied to fourth region for the binary 0 data state and a eighth voltage applied to the fourth region for the binary 1 data state.

15. The method according to claim 14, the seventh voltage is higher than the eighth voltage.

16. The method according to claim 1, wherein the semiconductor memory device is a semiconductor dynamic random access memory device.

17. The method according to claim 16, wherein each of the plurality of memory cells is a dynamic random access memory cell.

* * * * *